US006355532B1

(12) United States Patent
Seliskar et al.

(10) Patent No.: US 6,355,532 B1
(45) Date of Patent: Mar. 12, 2002

(54) SUBTRACTIVE OXIDATION METHOD OF FABRICATING A SHORT-LENGTH AND VERTICALLY-ORIENTED CHANNEL, DUAL-GATE, CMOS FET

(75) Inventors: John J. Seliskar, Northglenn, CO (US); Verne Hornback, Troutdale, OR (US); David Daniel, Vancouver, WA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/413,667

(22) Filed: Oct. 6, 1999

(51) Int. Cl.[7] .............................................. H01L 21/336
(52) U.S. Cl. ....................... 438/283; 438/213; 438/589; 438/157
(58) Field of Search ................................ 438/157, 176, 438/213, 217, 283, 291, 290, 589, FOR 191, FOR 193, FOR 216, FOR 217

(56) References Cited

U.S. PATENT DOCUMENTS

| | | | | |
|---|---|---|---|---|
| 5,008,214 A | * | 4/1991 | Redwine | |
| 5,264,395 A | | 11/1993 | Bindal et al. | |
| 5,300,450 A | * | 4/1994 | Shen et al. | |
| 5,426,070 A | | 6/1995 | Shaw et al. | |
| 5,480,838 A | * | 1/1996 | Mitsui | |
| 5,650,351 A | | 7/1997 | Wu | |
| 5,675,164 A | | 10/1997 | Brunner et al. | |
| 5,705,321 A | | 1/1998 | Brueck et al. | |
| 5,780,327 A | | 7/1998 | Chu et al. | |
| 5,932,911 A | | 8/1999 | Yue et al. | |
| 5,998,266 A | * | 12/1999 | So | |
| 6,040,218 A | * | 3/2000 | Lam | |
| 6,077,745 A | * | 6/2000 | Burns, Jr. et al. | |
| 6,111,296 A | | 8/2000 | Yamazaki et al. | |
| 6,180,441 B1 | * | 1/2001 | Yue et al. | |
| 6,208,164 B1 | * | 3/2001 | Noble et al. | |

FOREIGN PATENT DOCUMENTS

JP 200012813 A * 1/2000
JP 2000101052 A * 4/2000

OTHER PUBLICATIONS

FET design eyes nanoscale CMOS, By Sunny Bains, EE Times, Oct. 26, 1998, pp. 59–60.
Scaling Theory for Cylindrical, Fully–Depleted, Surrounding–Gate MOSFET's, By Christopher P. Auth, et al., IEEE Electron Device Letters, vol. 18, No. 2, Feb. 1997, pp. 74–76.
Monte Carlo Simulation of a 30 nm Dual–Gate MOSFET: How Short Can Si Go?, By D.J. Frank, et al., International Electron Devices Meeting, 1992, pp. 553–556.
Silicon–On–Insulator "Gate–All–Around Device," By J.P. Colinge, et al., International Electron Devices Meeting, 1990, pp. 595–598.
A Simple Model for Threshold Voltage of Surrounding–Gate MOSFET's, By Christopher P. Auth, et al., IEEE Transactions on Electron Devices, vol. 45, No. 11, Nov. 1998, pp. 2381–2383.

* cited by examiner

Primary Examiner—George Fourson
Assistant Examiner—Michelle Estrada
(74) Attorney, Agent, or Firm—John R. Ley, L.L.C.

(57) ABSTRACT

A short vertical channel, dual-gate, CMOS FET is fabricated by forming a plurality of channel segments in a starting material that extend longitudinally between source and drain areas. The channel segments are laterally separated from one another by spaces and are preferably formed from pillars of starting material located between the spaces. The pillars are laterally oxidized and the oxidation is removed to reduce the width of the pillars and form the channel segments. A gate structure is formed in the spaces between the channel segments. The width of each pillar is defined by conventional, contemporaneous photolithographic exposure and etching, but the width of each channel segment is substantially less than the width of the etch resistant barrier created photolithographically. The relatively narrow channel widths allow fully-depleted and fully-inverted conductivity characteristics which enhance the conductivity characteristics of the FET despite its reduced size, without silicon on insulator (SOI) constructions or epitaxial substrates.

37 Claims, 12 Drawing Sheets

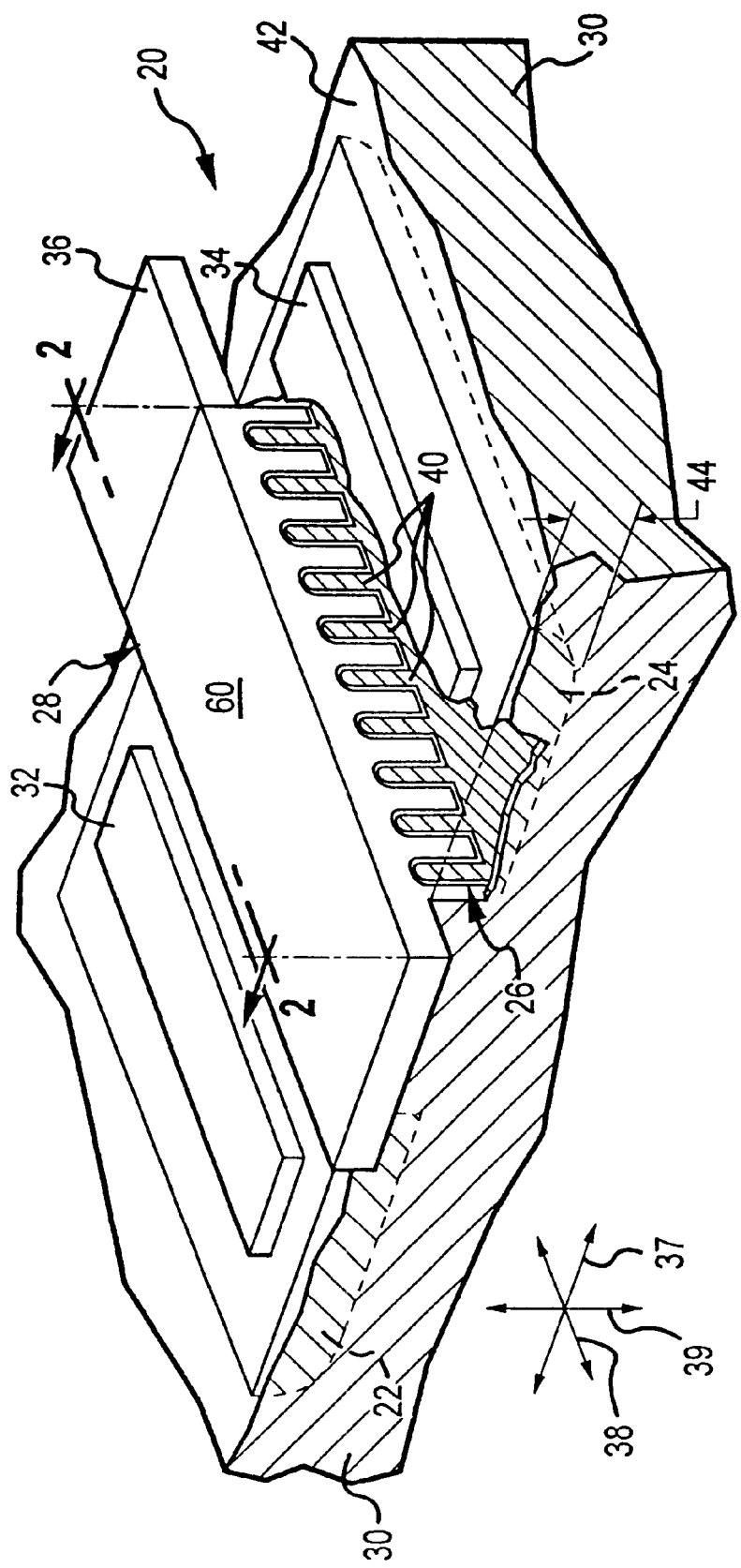
FIG._1

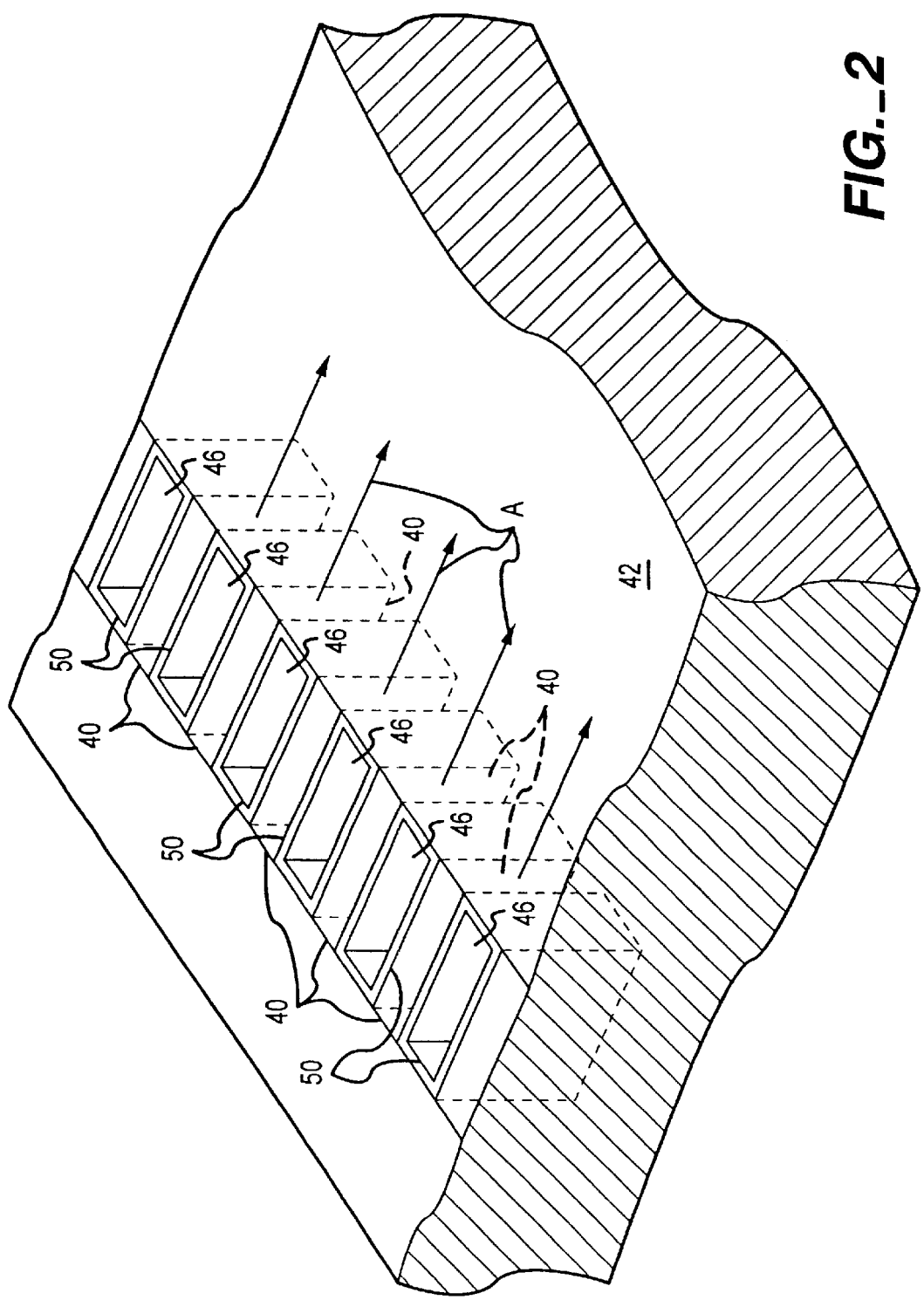
FIG._2

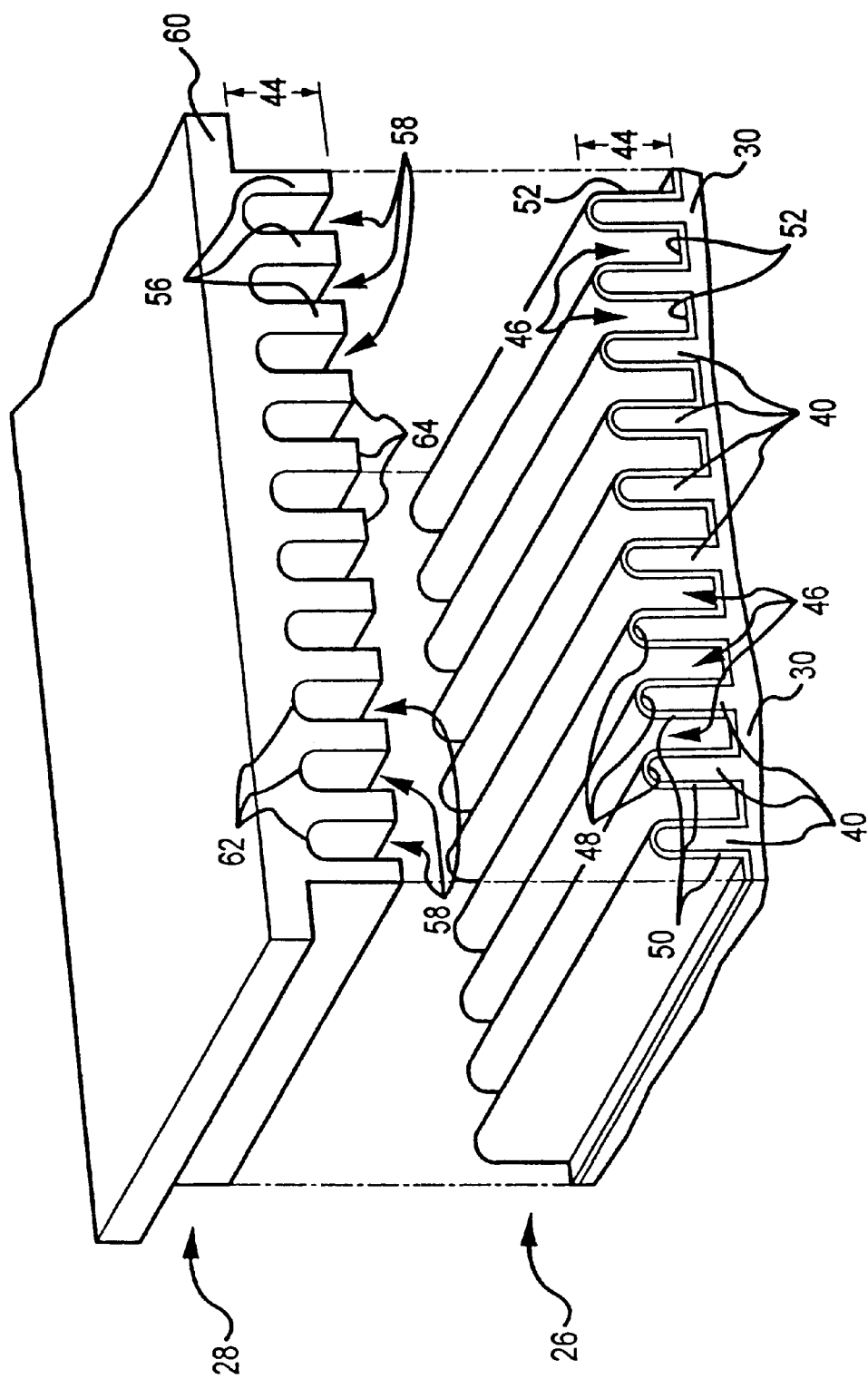
FIG._3

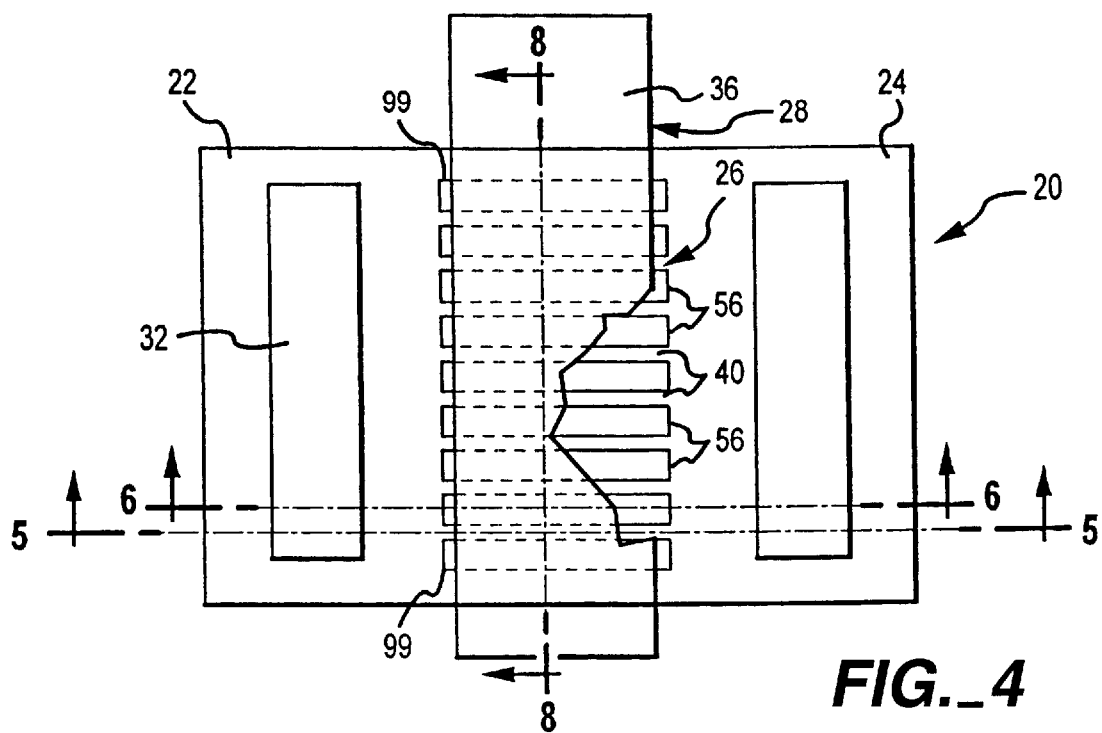
FIG._4
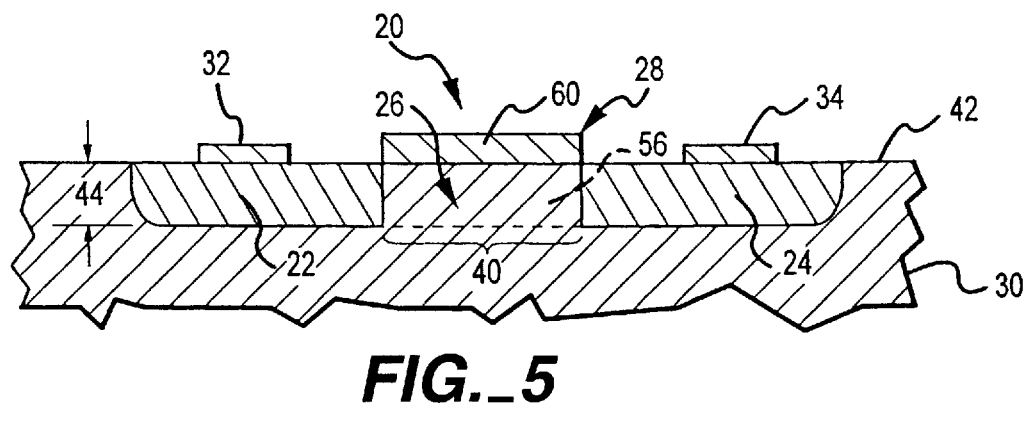
FIG._5
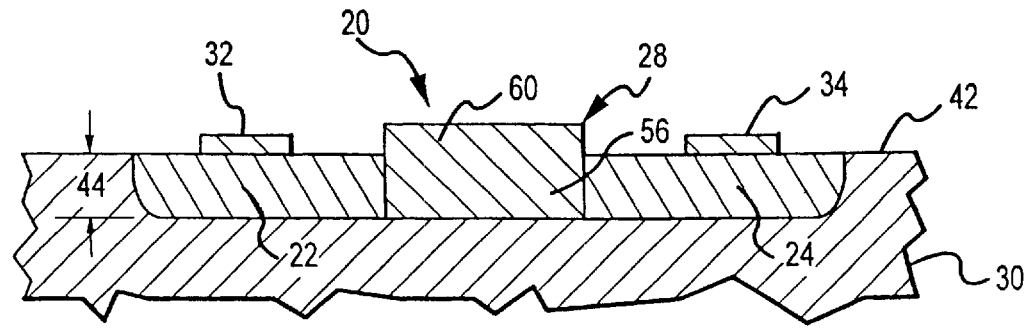
FIG._6

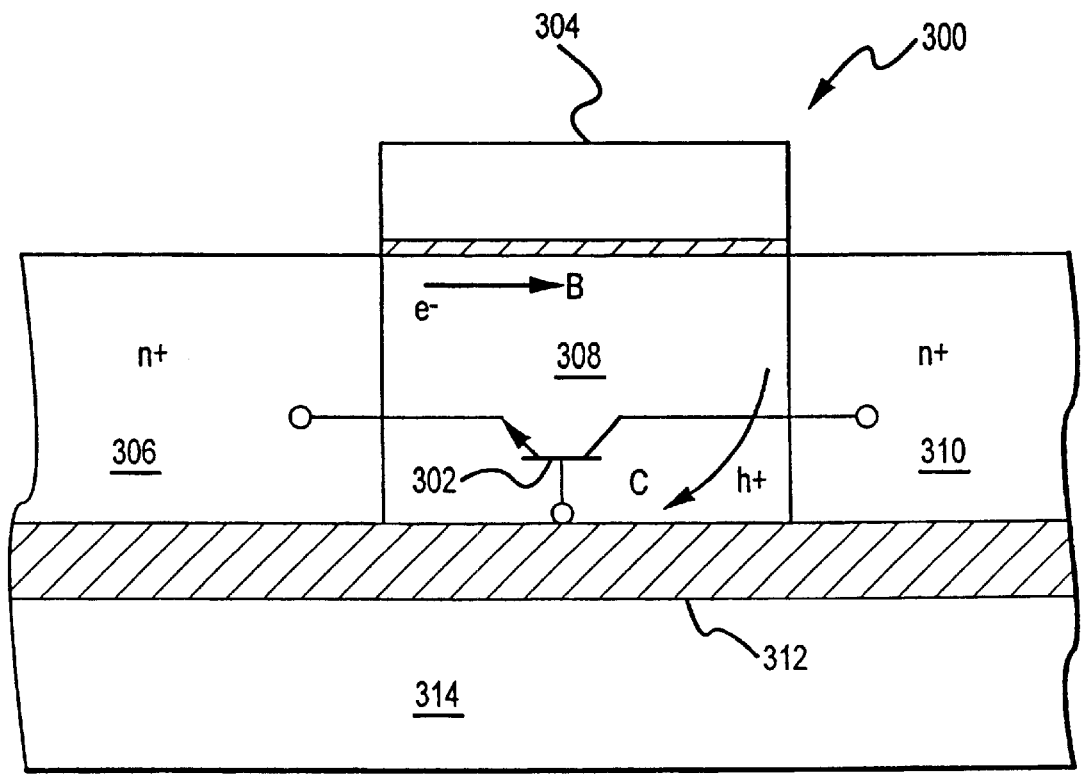
FIG._7
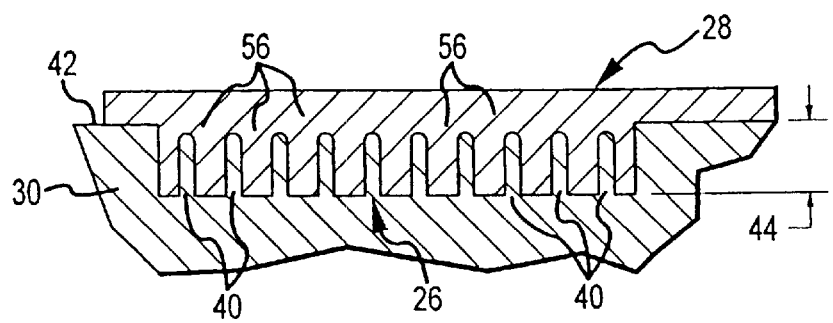
FIG._8

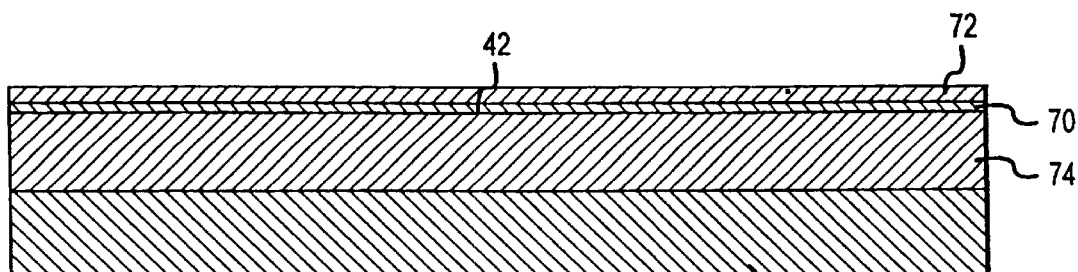
FIG._9
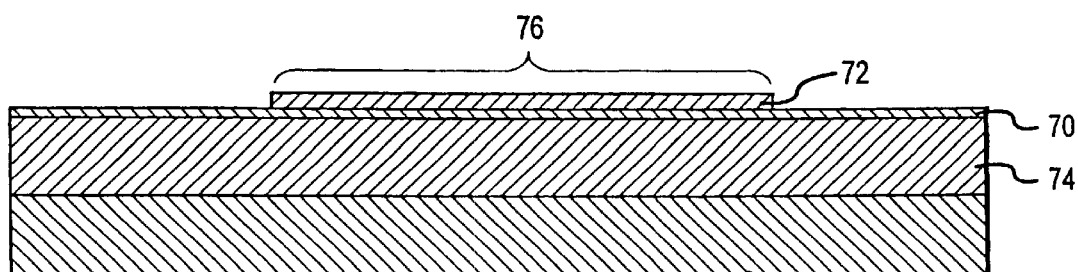
FIG._10
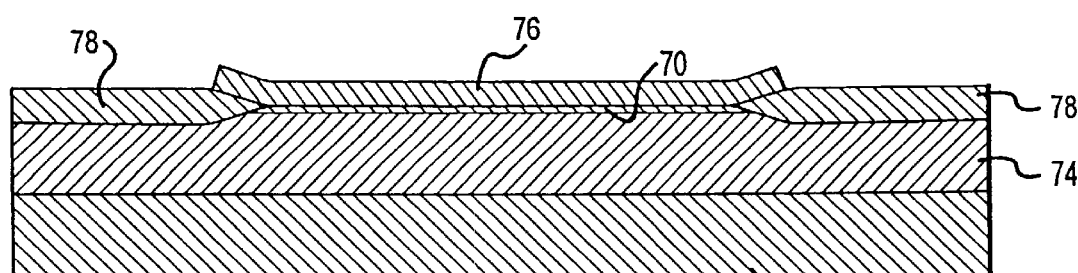
FIG._11
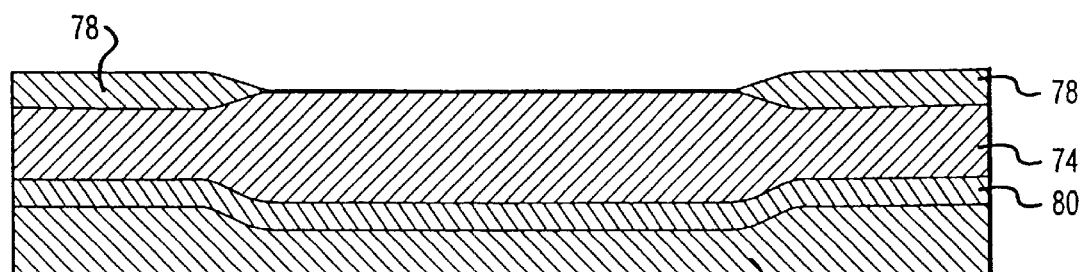
FIG._12

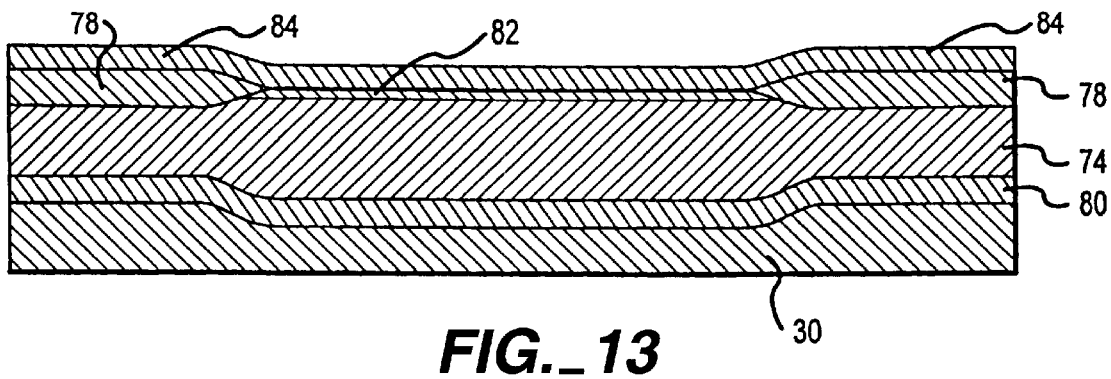
FIG._13
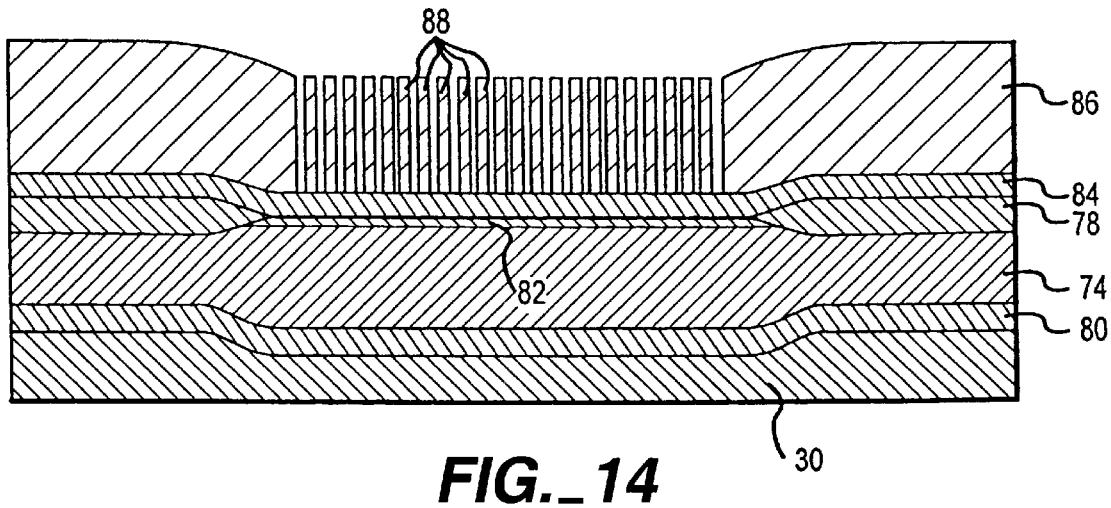
FIG._14
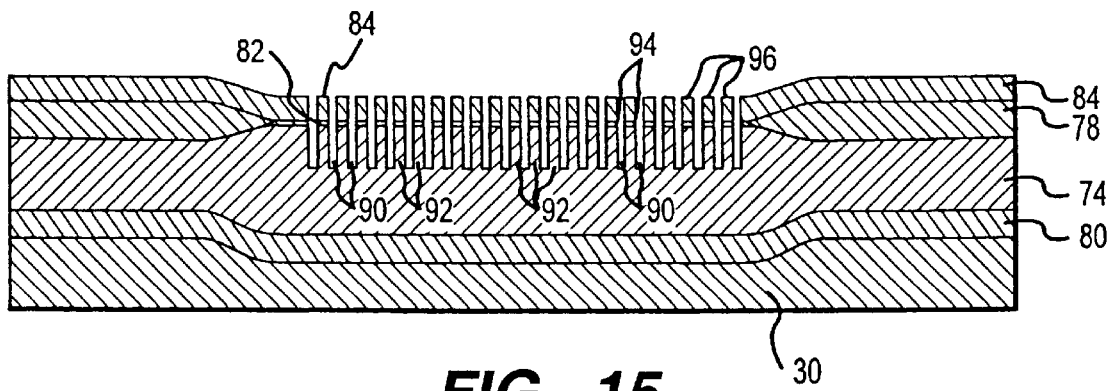
FIG._15

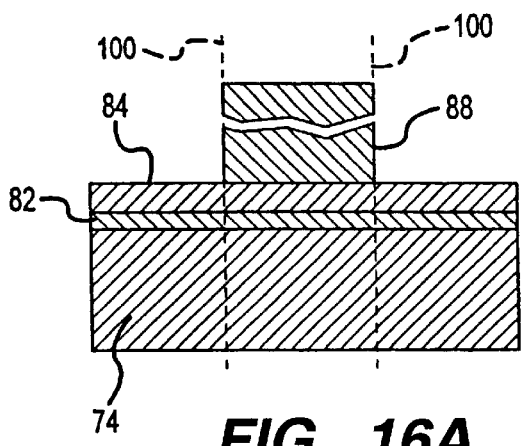
FIG._16A
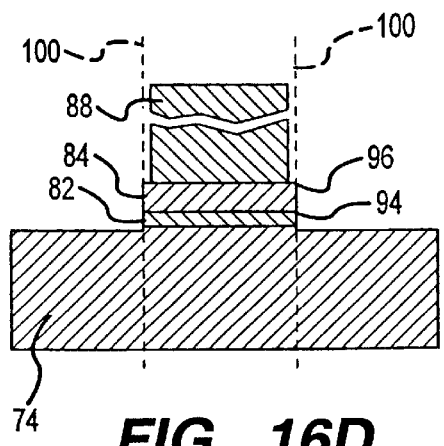
FIG._16D
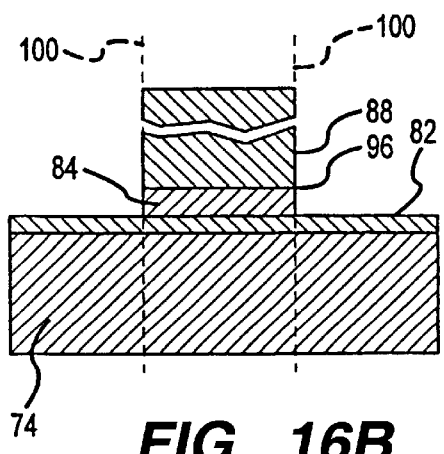
FIG._16B
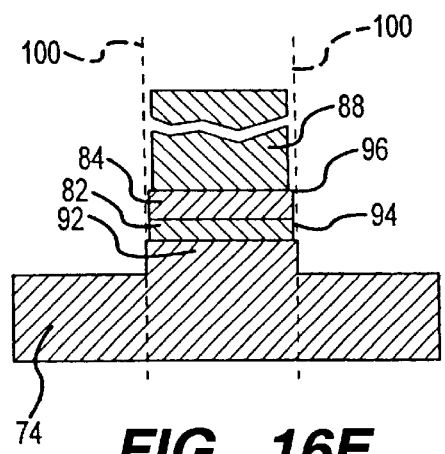
FIG._16E
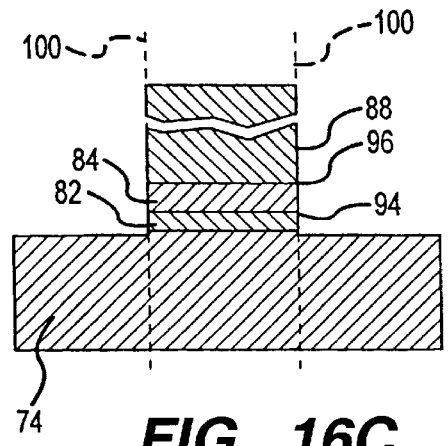
FIG._16C
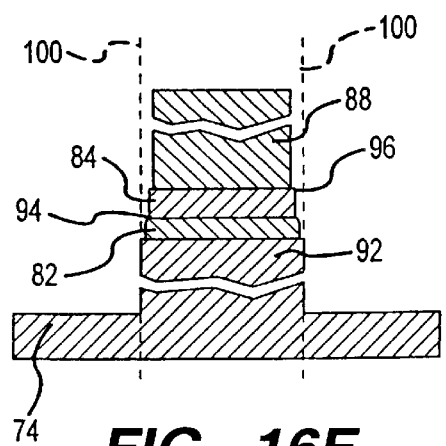
FIG._16F

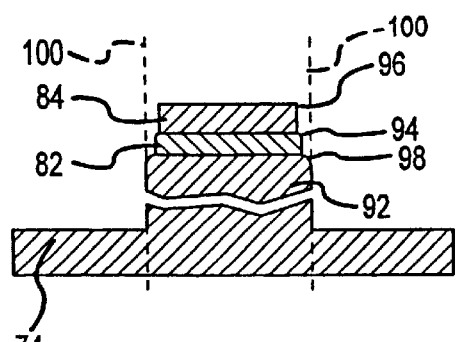
FIG._16G
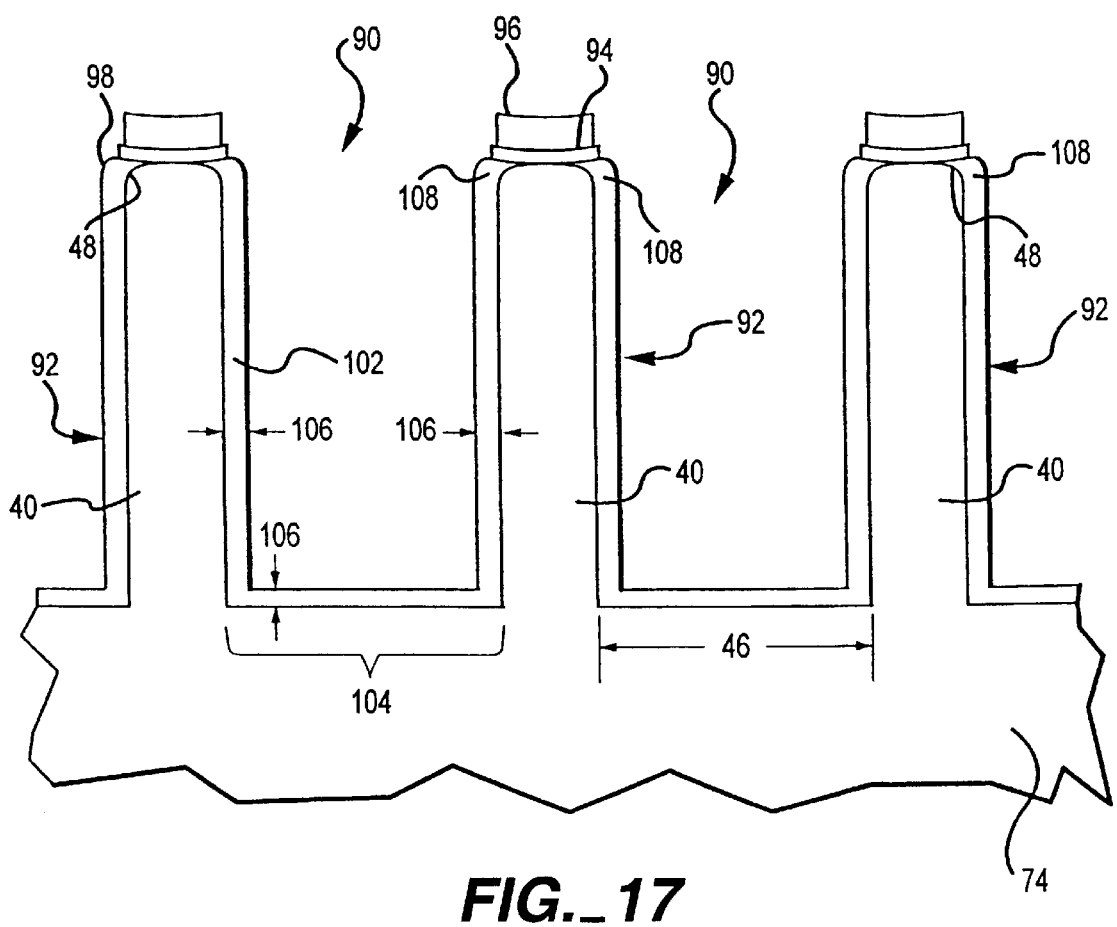
FIG._17

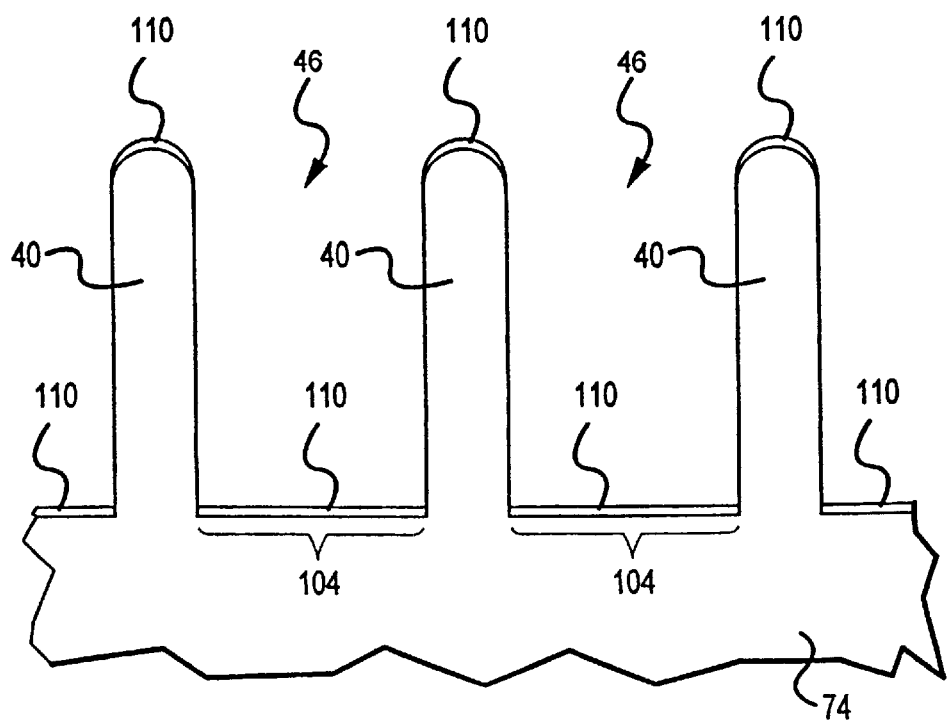
FIG._18
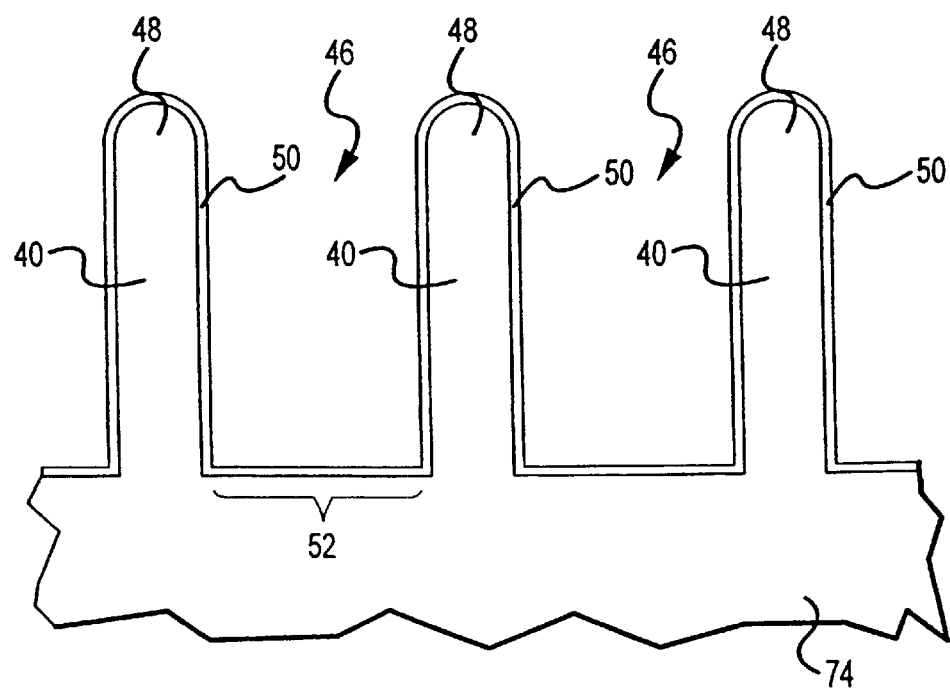
FIG._19

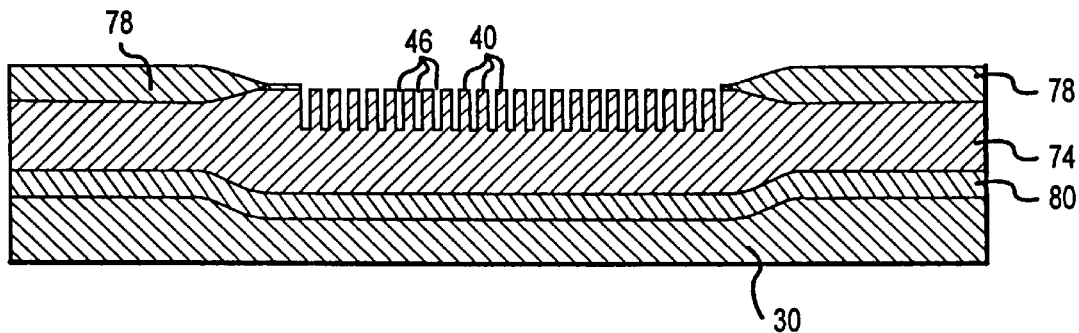
FIG._20
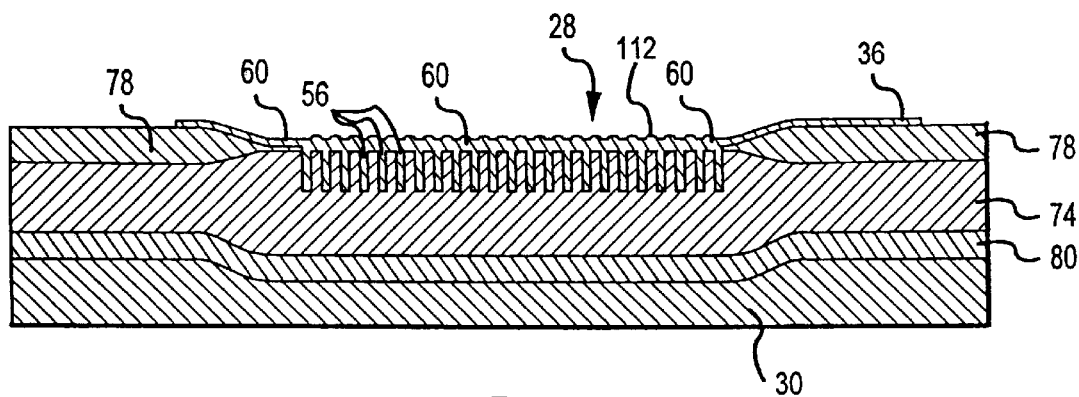
FIG._21
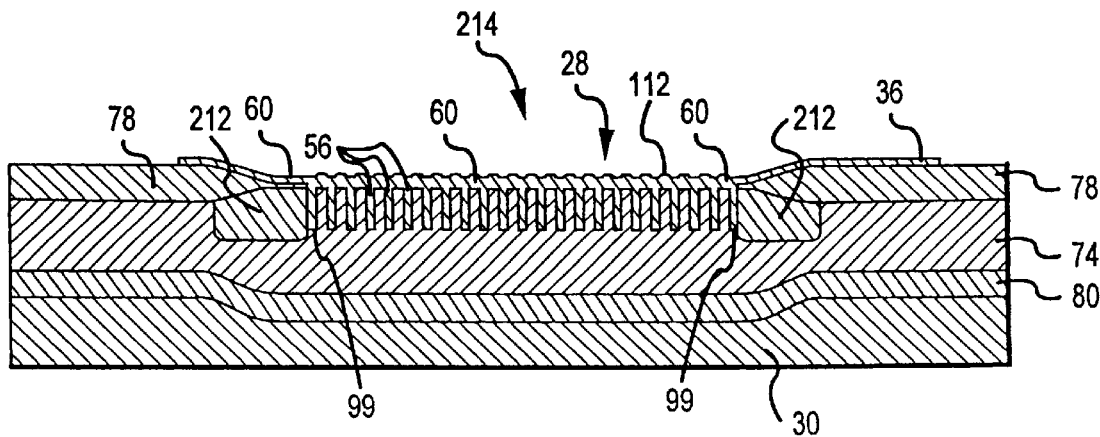
FIG._23

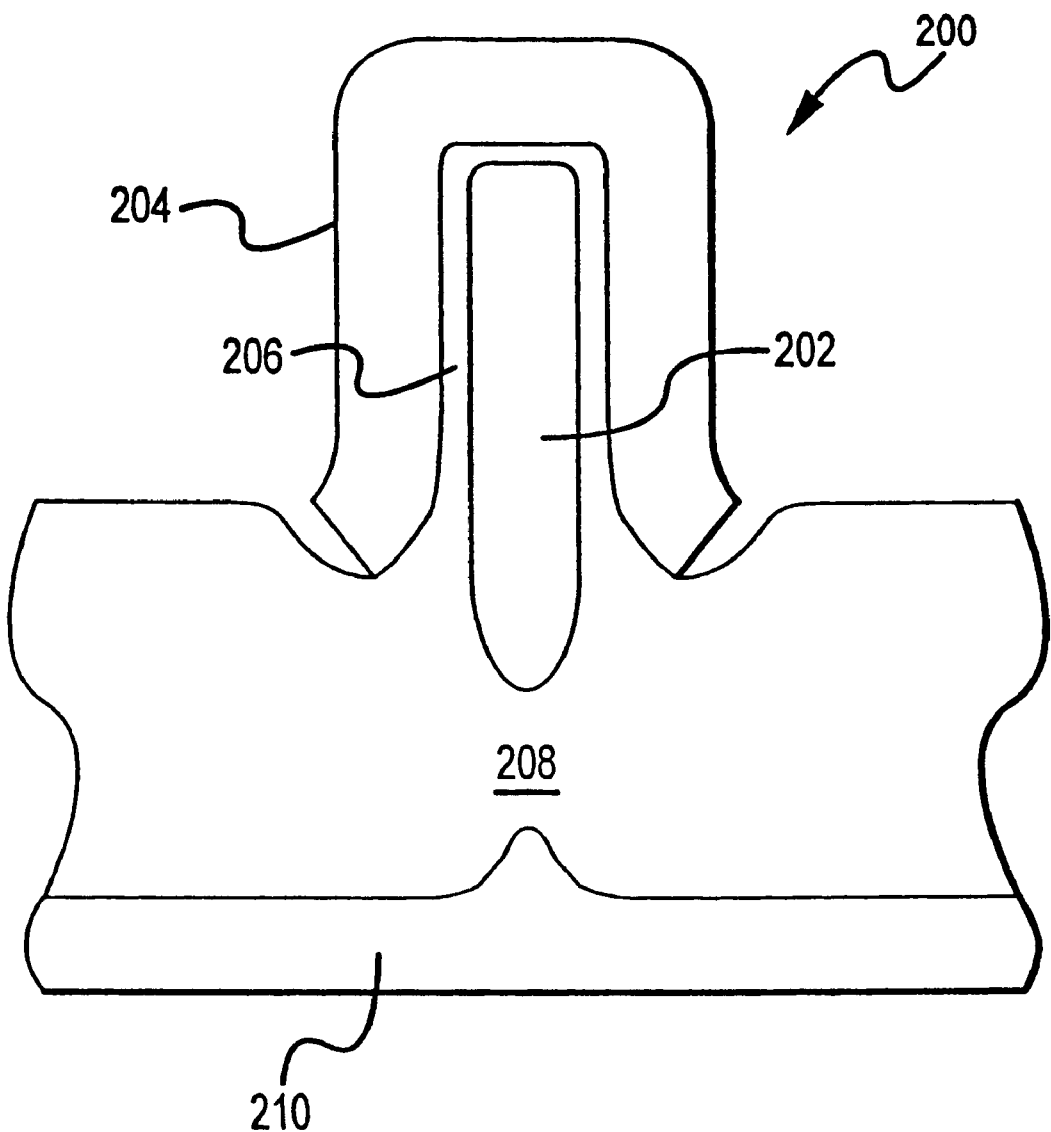
FIG._22

SUBTRACTIVE OXIDATION METHOD OF FABRICATING A SHORT-LENGTH AND VERTICALLY-ORIENTED CHANNEL, DUAL-GATE, CMOS FET

CROSS-REFERENCE TO RELATED APPLICATION

This invention is related to an invention for a Fully-Depleted, Fully-Inverted, Short-Length and Vertically-Oriented Channel, Dual-Gate, CMOS FET, described in U.S. patent application Ser. No. 09/413,666, filed concurrently herewith by the same inventors herein and assigned to the same assignee. The disclosure of this concurrently filed patent application is incorporated herein by this reference.

This invention relates to field effect transistors (FETs) formed in complimentary metal oxide semiconductor (CMOS) integrated circuits (ICs). More particularly, the present invention relates to a new and improved planar FET having a short-length and vertically-oriented channel structure interdigitated with a dual-gate structure to obtain fully-depleted and fully-inverted channel operating and conductivity characteristics. Moreover, the present invention relates to fabricating such an improved FET using conventional CMOS fabrication techniques, including photolithographic techniques which are incapable themselves of achieving structural widths as small as required for the FET to obtain the fully-depleted and fully-inverted channel operating and conductivity characteristics.

BACKGROUND OF THE INVENTION

During the two decades preceding this invention, the continual evolution of semiconductor technology has seen the size or topology of transistors shrink by about half at regular time intervals of approximately 18 months. As a result, the density of FETs in comparably-sized ICs has doubled that the same rate. It is predicted that this doubling effect will reach a point where physics and economics can no longer support such increases in density, and may reach proportions where no further density increases will be possible by using the presently-preferred, conventional planar CMOS fabrication techniques.

Conventional CMOS FETs are typically formed in a structural configuration referred to as "planar" because the various regions of the FET are formed in patterns established in a horizontal plane. For example, the source and drain regions are formed as horizontal planar structures extending downward into a substrate from an upper horizontal surface. Similarly, the channel structure of the FET, which extends between the source and drain regions, is also formed as a horizontal planar structure. The gate structure extends as a generally planar layer of material formed on top of the channel structure. Although all of these regions and components have a vertical dimension, the majority of their influence in the FET is achieved because of the horizontal extent of their regions and structures. The typical CMOS fabrication technique utilizes these planar configurations because they are easily fabricated in a horizontal plane using conventional techniques which are directed vertically downward onto the substrate or other structures formed on top of the substrate.

The planar aspects of the conventional CMOS structures have been recognized as a significant limitation on the continually diminishing size evolution in CMOS FETs. For example, as the size of the source, drain, channel and gate regions are reduced in the horizontal plane, the length of the channel becomes shorter, placing the source and drain regions in closer proximity with one another. This closer proximity diminishes the ability of the gate structure to control conductivity through the channel, and hence the conductivity of the FET itself. These adverse influences on the conductivity characteristics of the FET are referred to as short channel effects.

Short channel effects are explained as follows. Conductivity through the channel is controlled by a vertical electric field created by the gate voltage in a direction perpendicular to the flow of current in the channel. However, an electric field is also created by the charged source and drain regions. The source and drain fields encroach laterally onto the channel. As the channel length shortens, the lateral drain and source fields have a greater influence on the channel conductivity characteristics. With a sufficiently short channel, the lateral source and drain fields can cause the gate field to lose control over the FET conductivity, even to the extent of creating a short between the source and the drain, thus diminishing or destroying the operating characteristics of the FET.

Shrinking the size of the FET structure also requires reducing the size of the gate oxide and source and drain regions, thus creating the requirement that the power supply voltage must also be reduced to maintain gate oxide integrity and junction breakdown margins to prevent wear out due to voltage stress and diminished lifetime resulting from hot carrier injection. Reducing the voltage of the power supply creates semiconductor package and circuit board-level design problems to accommodate multiple different power supply voltage levels. Such requirements increase the cost of semiconductor fabrication as well as future costs of developing technology.

FET structures which are alternatives to planar structures have been conceived as partial solutions to the diminishing size problems. One such structure is a dual-gate structure. In general, a dual-gate structure involves placing a gate on opposite sides of the channel. Because both sides of the channel are thereby subjected to the gate field, rather than the single side of the channel in a conventional planar FET structure, the gate will maintain a predominant field affect over the lateral fields from the source and drain even when the length of the channel is reduced. The difficulty with dual-gate FET structures is that they are very difficult to manufacture. The manufacturing difficulties have prevented dual-gate FETs from achieving a significant level of commercial acceptability.

One type of dual-gate FET involves a "gate-all-around" configuration. The gate-all-around configuration is created by forming a cavity beneath a silicon channel structure by an isotropic etch. After gate oxidation, the cavity under the channel silicon structure is under-filled by polysilicon which is deposited by chemical vapor deposition. Thereafter, gate material is placed over the top of the channel silicon structure and in contact with the under-filled material in the cavity. The resulting gate structure completely surrounds the silicon channel structure, thereby causing the gate to completely encircle the channel. Ends of the channel structure become the source and drain. The gate-all-around fabrication process is very complex and difficult to execute on a reliable and consistent basis.

Another method of forming a gate-all-around MOSFET structure provides for forming a tunnel of the gate material. The source, channel and drain are then created by epitaxially growing silicon through the preformed tunnel.

Another type of a dual-gate FET is called a "delta" configuration. The delta configuration involves forming a generally rectangular wall of silicon which extends vertically upward from the substrate, positioning the rectangular wall on a narrow edge. The vertical extension of the wall is usually formed by eroding or otherwise eliminating areas of the substrate adjacent to the junction of the vertically-extending wall with the substrate. Gate material is thereafter deposited over the sides and top of the wall. A field oxidation process may cause the field oxide to penetrate the bulk silicon at the base of the junction of the wall with the substrate until the field oxide on both sides of the wall junction meet, thereby "pinching off" the channel from the bulk silicon. The gate material surrounds the wall on at least three sides, thereby establishing a gate electric field over most of the silicon structure which forms the channel. Ends of the silicon wall structure which extend out beyond the gate material become the source and drain regions for the FET.

Another type of structure that is similar to the gate-all-around MOSFET is called the "surrounding-gate" MOSFET. A vertical pillar of silicon is surrounded or wrapped by the gate material. The base of the silicon pillar is connected to the substrate, or a structure formed on the substrate, and forms the source. The top of the pillar protrudes out of the surrounding gate material and forms the drain. The pillar of a surrounding-gate MOSFET may be cylindrically or elongated rectangularly shaped in a top view cross section. Fabrication processes may cause the short edges of a rectangular pillar to be rounded. The cylindrical pillar configuration is essentially a special case of the rectangular configuration in which all the edges are short and the device fabrication processes cause the entire pillar to be rounded. These devices are asymmetrical since the source and the drain are not similar, as is the case in many horizontal configurations. Additionally, fabrication of these devices must utilize non-planar techniques.

Both the gate-all-around and the delta FET structures are typically formed using silicon-on-insulator (SOI) technology. SOI technology involves forming the FET structures on an insulating layer. Isolating the FET structure from the substrate by the insulating layer is believed to enhance short channel behavior because the transistor is less susceptible to breakdown and leakage currents and because of a general increase in performance as a result of a diminished capacitance with the substrate. However, SOI FETs are more susceptible to undesirable snapback and parasitic surface transistor effects because of the isolation of the source, drain and channel structure from the substrate.

Short channel FETs are also fabricated on epitaxial substrates, which are more expensive than bulk substrates. Some dual-gate FET structures also require that the material of certain components be grown epitaxially during the fabrication of the transistor. The epitaxial growth of components during transistor fabrication is time-consuming and expensive.

The gate-all-around, surrounding-gate and delta FET structures are difficult to construct on a consistent, reliable basis. Furthermore, SOI and epitaxial structures are also expensive. The surrounding-gate structures require pillars that are tall and difficult to construct. Moreover, all previously known processes for fabricating dual-gate FETs are very complex, and require steps and procedures which are considerably more complex and difficult to execute than conventional CMOS fabrication techniques. As a consequence, the previously-known dual-gate FET structures are not economically feasible to fabricate on a commercial, large-volume basis at the present time.

It is with respect to these and other background considerations that the present invention has evolved.

SUMMARY OF THE INVENTION

In its most general sense, the present invention relates to a method of fabricating a field effect transistor (FET) which comprises the steps of forming a plurality of channel segments in a starting material, with the channel segments extending longitudinally between source and drain areas. The channel segments are laterally separated from one another by spaces. The channel segments are preferably formed from pillars of starting material located between the spaces, and the pillars are laterally oxidized from within the spaces. The lateral oxidation is removed to reduce the width of the pillars and form the channel segments. A gate structure is formed in the spaces between the channel segments. Preferably, a bridge structure extends over the channel segments and connects to the upper ends of gate segments between the channel segments.

A reduced aspect ratio FET having a dual gate structure and a short-length and preferably vertically-oriented channel structure is obtained, and the resulting FET is substantially immune to or resistant to adverse short channel effects. The FET may be fabricated using conventional CMOS fabrication steps, augmented only by the additional step of subtractive oxidation to create the channel structure.

Additional preferable steps employed in forming the channel segments from the pillars include forming an etch-resistant barrier, preferably photoresist material or film stack, on top of the starting material at the location of each pillar, and etching the spaces into the starting material between each of the etch-resistant barriers on top of each pillar after photolithographically exposing and developing the layer of photoresist material. The width of the etch-resistant barrier is made as narrow as possible by photolithographic exposure. The subtractive oxidation of the pillars laterally reduces their width to create the channel segments which have a width substantially less than the width of the etch resistant barrier and which is less than that which can be obtained from contemporary conventional photolithographic patterning techniques. However, conventional CMOS photolithographic patterning techniques and subtractive oxidation are used to create the channel segments.

The relatively narrow channel widths allow fully-depleted or fully-inverted conductivity characteristics which enhance the performance of the FET despite its reduced size. The fully-depleted and fully-inverted conductivity characteristics are obtained from a bulk substrate without the need for a SOI or epitaxial substrate or the epitaxial growth of structures within the FET structure.

Further improvements in the formation of the channel segments are obtained by the preferable steps of oxidizing the pillars laterally with the etch-resistant barrier and an oxidation-resistant cap (preferably silicon nitride) remaining on top of the pillars, preferably while laterally etching the etch-resistant barrier to reduce the width of the barrier and to expose upper corners of the pillar material to erosion when etching the spaces. An oxide cap layer may also be formed between the oxidation-resistant cap and an upper end of each pillar. The laterally outer side walls of the pillars are oxidized to a desired thickness, such that the oxidized portion grows in thickness. The upper end of each pillar, directly under the oxide cap layer, is also grown in thickness at laterally outer locations adjacent to the side walls of the pillars, and this growth results in oxidizing the upper lateral outside corners of the pillar material in a rounded corner configuration or upper rounded ends, or longitudinally-extending edges on the channel segments. The oxide cap layer protects the center of the upper end of the pillars against oxidation during lateral oxidation of the pillars. The upper rounded ends or curved edges prevent carrier tunneling from the gate to the bulk of the FET structure, thereby avoiding gate oxide breakdown and diminished gate oxide integrity. The improved gate field characteristics also result in greater immunity from hot electron impact on the gate and prolong useful longevity of the FET.

Further preferable improvements in the fabrication steps involve implanting a layer of material into the upper end of each channel segment, and implanting a layer of material into the starting material beneath each space. The implanted layers turn off any parasitic surface transistor at those locations, thereby further enhancing the performance of the FET.

The dual-gate structure is formed on opposite sides of the narrow channel structures using conventional self-aligning CMOS material deposition techniques to create the gate structure, preferably from in situ doped polysilicon. Each channel segment has a lateral width which is substantially less than a lateral width of each gate segment, to accommodate the self-aligning deposition. A variety of other conventional CMOS techniques may be retained in fabricating the small aspect ratio FET, such as forming the gate structure with a plurality of generally vertically oriented gate segments positioned between the vertically oriented channel segments, forming the channel segments in a generally rectangularly shaped configuration, forming the channel segments in a generally parallel aligned relationship with one another, forming the starting material by forming a well in a substrate material, forming the source and drain areas generally in a planar configuration, and implanting the source and drain areas into the starting material. Despite the shorter channel length, an enhanced source-drain breakdown voltage characteristic is obtained because the source and drain regions may be implanted to greater depths. An enhanced tolerance for, or an increased capability to withstand, higher supply voltages is obtained because of the ability to increase the thickness of the gate oxide while still reducing the size of the components within the FET to achieve a smaller overall aspect ratio.

The FET structure may be fabricated on bulk substrate, avoiding the added costs associated with epitaxial or SOI substrate processing. The configuration of the dual-gate and channel structures avoids parasitic and snapback problems common to SOI structures. In general, the FET structure of the present invention may be fabricated on a reliable, economic, large-scale commercial basis, despite size reduction.

A more complete appreciation of the present invention and its scope, and the manner in which it achieves the above noted improvements, can be obtained by reference to the following detailed description of presently preferred embodiments of the invention taken in connection with the accompanying drawings, which are briefly summarized below, and the appended claims.

BRIEF DESCRIPTION OF THE DRAWINGS

FIG. 1 is a perspective view of a FET structure incorporating the present invention, shown in a substrate of an integrated circuit with portions broken out for clarity of illustration.

FIG. 2 is an enlarged perspective view of a channel structure of the FET structure shown in FIG. 1.

FIG. 3 is an enlarged and exploded perspective view of an interdigitated gate structure and channel structure of the FET structure shown in FIG. 1.

FIG. 4 is a top planar view of the FET structure shown in FIG. 1, shown in reduced dimensions with a portion broken out for clarity of illustration of the gate and channel structures.

FIG. 5 is a cross-sectional view taken substantially in the plane of line 5—5 shown in FIG. 4.

FIG. 6 is a cross-sectional view taken substantially in the plane of line 6—6 shown in FIG. 4.

FIG. 7 is a cross-sectional view of a prior art silicon on insulator (SOI) FET with a superimposed schematic diagram of a transistor.

FIG. 8 is a cross-sectional view taken substantially in the plane of line 8—8 shown in FIG. 4.

FIGS. 9–15 are cross-sectional views taken generally along the plane of line 8—8 shown in FIG. 4, illustrating the sequence of steps involved in fabricating the FET structure shown in FIGS. 1–6 and 8.

FIGS. 16A, 16B, 16C, 16D, 16E, 16F and 16G are enlarged cross-sectional views illustrating further details of a sequence of steps involved in fabricating upper ends of the channel segments as shown in FIG. 15.

FIGS. 17, 18 and 19 are cross-sectional views of a few channel segments illustrating an oxidation step, an implantation step and a gate oxide formation step performed on the channel segments after completion of the step shown in FIG. 16G.

FIGS. 20 and 21 are cross-sectional views similar to those shown in FIGS. 9–15, which further illustrate additional fabrication steps to complete the FET structure shown in FIGS. 1–6 and 8.

FIG. 22 is a cross sectional view of a prior art delta FET.

FIG. 23 is a cross sectional view of the FET structure shown in FIG. 21 with an additional dopant pocket structure.

DETAILED DESCRIPTION

A field effect transistor (FET) 20 which incorporates the present invention is shown in FIG. 1. The FET 20 includes a source diffusion area 22, a drain diffusion area 24, a channel structure 26, and a dual-electrode gate structure 28, or dual-gate structure. The source and drain diffusion areas 22 and 24, and the channel structure 26 are formed in a substrate 30 in which the FET 20 and other semiconductor structures (not shown) of an integrated circuit (IC) are formed. The gate structure 28 is deposited or otherwise formed in and on top of the channel structure 26 formed in the substrate 30. A method of fabricating the FET 20 is discussed in greater detail below, in conjunction with FIGS. 9–21.

Contacts 32 and 34 are formed on and connected to the source and drain diffusion areas 22 and 24, respectively. A source voltage potential (Vss) is applied to the source diffusion contact 32 and a drain voltage potential (Vdd) is applied to the drain diffusion contact 34.

Current is conducted through the channel structure 26 between the source and drain diffusion areas 22 and 24 when the FET 20 is conductive. The current conductivity of the FET 20, as well as the degree of current conductivity, is controlled by a voltage signal applied to a gate contact 36 formed on the gate structure 28. The magnitude of the gate control voltage signal throughout the gate structure 28 imposes an electrical field on the channel structure 26. The extent of this electrical field, determined by the relative voltage of the gate control signal, determines whether the FET 20 is conductive or non-conductive, and if conductive, the relative degree of current conductivity through the channel structure 26 between the drain and source diffusion areas 24 and 22. Electrical conductors (not shown) connect to the contacts 32, 34 and 36 to apply the potentials and signals necessary for operation of the FET 20.

Three mutually perpendicular reference directions 37, 38 and 39 are employed in the following description to describe the structure of the FET 20. The reference direction 37 describes a length or longitudinal dimension. The reference direction 38 refers to a width or lateral dimension. The reference direction 39 is used to describe a height, depth, thickness or vertical dimension.

As shown in FIGS. 1–4, the channel structure 26 is formed by a plurality of individual, parallel-oriented channel segments 40, each of which is generally rectangularly shaped, when viewed in the length and height dimensions. Each channel segment 40 extends completely between the source and drain diffusion areas 22 and 24, respectively. The channel segments 40 conduct current between the source and drain diffusion areas 22 and 24, such as in the direction of arrows A (FIG. 2). The number of channel segments 40 determines the current capacity of the FET 20.

The length of each channel segment 40 is about the same as the length of the other channel segments 40, and that length extends between the source and diffusion areas 22 and 24. The height of each channel segment 40 is also preferably about the same, and that height is not necessarily, but may be, the same as the depth to which the source and diffusion areas 22 and 24 are formed downwardly into the substrate from an upper planar surface 42 (FIGS. 1 and 2) of the substrate 30. The depth of the source and drain diffusion areas 22 and 24 are generally represented by the dimension 44, but the height of the channel segments 40 may extend differently.

Each of the channel segments 40 is laterally separated from an adjoining channel segment 40 by a space 46. These spaces 46 are formed as generally rectangular slots as shown in FIG. 2. The laterally spaced channel segments 40 extend across the entire width-wise span of the channel structure 26, from one lateral side of the FET 20 to the other lateral side, as is also shown in FIG. 4. The spaces 46 between the channel segments 40 are approximately uniform, thereby laterally spacing the channel segments 40 from one another at regular and uniform intervals (FIGS. 2 and 8).

The width of each channel segment 40 is generally considerably less than the width of each space 46. Preferably, the width of each channel segment is less than the width which could be created by using the conventional photolithographic and etching techniques in widespread commercial use at the time of filing the patent application for this invention. In general, the width of the channel segments 40 is determined by the requirements to create a fully depleted region in the channel segments 40. To achieve this effect, it is preferable that the width of the channel segments 40 be approximately no greater than 800 angstroms. A width of this magnitude will assure fully-depleted and fully-inverted conductivity characteristics of the channel structure 26. Thus, the plurality of channel segments 40 extend in a parallel longitudinal relationship with one another and in parallel rows which are laterally spaced from one another by the width of the spaces 46.

Other prior art FET structures are known that have employed small pillar-like protrusions of channel material. However, it is understood that these protrusions have not been for the purpose of forming channel segments such as those illustrated in FIGS. 1, 2 and 3. Rather, these protrusions have been formed for the purpose of exploiting the corner conduction properties of sharply angled corners in a channel region. Thus, these protrusions have been formed with carefully squared-off top portions, unlike the channel segments 40 described herein, which are shown with preferably rounded top portions 48 (FIG. 3) which prevent corner conduction from occurring.

Preferably, and as is described more completely below in conjunction with the fabrication method of the FET 20, the channel segments 40 are initially formed from a single diffusion of dopant material into the substrate. The source diffusion area 22 and the drain diffusion area 24 are typically formed by conventional CMOS fabrication techniques with a diffusion of dopant material into the substrate after the channel structure 26 and gate structure 28 are formed. Preferably, the source and drain diffusion areas 22 and 24 are doped more heavily than the channel segments 40. The diffusions of the dopant material change the conductivity characteristics of the source and drain diffusion areas 22 and 24 and of the channel segments 40 from the conductivity characteristics of the substrate 30 in a known manner consistent with the fabrication of sources, drains and channels of a FET.

The source and drain areas and the channel structure may be formed using conventional planar FET fabrication techniques. The source and drain diffusion areas 22 and 24 retain their planar characteristics in the FET 20, but the initial planar characteristics of the channel area are transferred into the vertically-oriented channel segments 40, by the fabrication method discussed below.

Preferably, the upper end 48 of each channel segment 40 is formed as a rounded end, or with rounded edges, thereby avoiding sharp corners on the upper edges of the channel segments 40. Ideally, the upper end 48 of each channel segment 40 would be completely rounded as shown in FIGS. 1, 3, 8, 18 and 19, but realistically, due to the fabrication techniques, the upper ends 48 will be flat with rounded corners in a structure somewhere between the pillar 92 shown in FIG. 16G having slightly rounded corners 98 and the channel segment 40 shown in FIG. 19 having a rounded top end 48.

A layer 50 of gate oxide is formed on the exterior of the channel segments 40, as shown in FIG. 2. The gate oxide layer 50 separates channel segments 40 from the gate structure 28, and functions in basically the same manner as in a conventional FET. However, an improvement available from the present invention is that the thickness of the gate oxide layer 50 may be established by a more favorable scaling law associated with the formation of other components of the FET 20 than in the prior art. Unlike the requirement for diminished thicknesses of the gate oxide when scaling conventional planar FETs, the thickness of the gate oxide layer 50 has a more relaxed specification, because its thickness does not depend as strongly on the length, width and height dimensions of other components of the FET as in the prior art. The desired thickness of the gate oxide layer 50 allows the FET to suppress short channel effects while still remaining thick enough to stand-off higher applied voltages than possible with conventional scaling.

The upper rounded end 48 (or rounded edge configuration) avoids the well-known corner sharpening effect that will result in Fowler-Nordheim tunneling from the gate structure 28 into the bulk substrate 30 of the final FET structure 20. The corner sharpening effect might possibly cause breakdown of the gate oxide layer 50, and/or a diminished integrity of the gate oxide layer 50. Either a breakdown or a diminished integrity of the gate oxide layer 50 will cause premature failure of the FET 20. Likewise, lower ends 52 of the spaces 46 between the channel segments 40 are generally rectangularly shaped and therefore extend at an approximate perpendicular angle to the vertical extension of the channel segments 40. The corner locations of the lower ends 52 relative to the channel segments 40, if not rounded, offer the potential to create the undesired Fowler-Nordheim tunneling effect. The subtractive oxidation process (described below with reference to FIG. 17) naturally results in rounded corners at the lower ends of the spaces 46, thereby eliminating Fowler-Nordheim tunneling effects.

Parasitic surface FET effects at the upper rounded end 48 and at the lower ends 52 can be avoided by adding additional implants 110 (shown in FIG. 18) at the lower ends 52 of the spaces 46 and at the upper ends 48 of the channel segments 40. These implants turn off the parasitic surface FETs, thereby minimizing the possibility of short channel effects and leaving only the dual-gated channel as the primary conductance path.

An additional parasitic FET effect is caused by perimeter leakage around the outermost gate segment 99. This perimeter leakage may be reduced or eliminated by adding a dopant pocket outside the outermost gate segments 99 as described more fully below with reference to FIG. 23.

The gate structure 28 includes a plurality of individual, parallel-oriented gate segments 56 (FIG. 3), each of which is generally rectangularly shaped, but generally conform to the resulting shape of the slots, or spaces 46, shown in FIG. 2, since the gate segments 56 are formed in the slots. The gate segments 56 are integrally connected to an upper bridge segment 60 of the gate structure 28. The gate segments 56 extend downward from the bridge segment 60, and are laterally spaced from one another, at regular and uniform intervals defined by the spaces 58. Consequently, each gate segment 56 is therefore separated from its adjoining gate segment 56 by the uniform width of space 58.

Each gate segment 56 has approximately the same height as each of the other gate segments 56. That height may be, but is not necessarily, the same vertical dimension as the depth of the source and diffusion areas 22 and 24, as generally represented by the dimension 44, shown in FIGS. 1, 5, 6 and 8. Each gate segment 56 also has a length which is approximately the same as the length of the other gate segments 56, and that gate length is about equal to the length of the channel segments 40, as shown in FIGS. 3–6.

As illustrated in FIGS. 5 and 6, it is preferred that the FET 20 is not fabricated above an insulating layer as in a silicon on insulator (SOI) construction. Rather, the FET 20 can be fabricated on a bulk substrate 30, thereby eliminating some of the problems associated with SOI technologies, such as snapback and parasitic transistors. FIG. 7 illustrates a parasitic transistor problem in a prior art FET 300 with SOI technology A transistor symbol, representing a parasitic NPN bipolar transistor 302, is superimposed onto the cross section of the FET 300. Proper operation of the FET 300 occurs when a control voltage applied to a gate 304 controls the flow (arrow B) of electrons (e$^-$) from a source 306 through a channel 308 to a drain 310. Short channel devices can create "hot electrons" that cause impact ionization in the region of the channel 308 near the drain 310 and the gate 304. The resulting holes (h$^+$) generated by the impact ionization can cause a hole current (arrow C) that charges a floating base 312 or insulating layer above the underlying silicon 314. As a result, a parasitic NPN bipolar transistor 302 forms and causes the FET 300 to latch-up to itself in a phenomenon known as snapback. Since the FET 20 (FIGS. 1 and 4–6) does not have an insulating layer 312 (FIG. 7), any resulting hole current from any impact ionization due to hot electrons in the channel segments 40 empties into the bulk substrate 30 without causing the latch-up, snapback problems.

The laterally spaced gate segments 56 extend entirely across the width-wise span of the gate structure 28, from one lateral side of the FET 20 to the other lateral side (FIG. 4). The width of each gate segment 56 is generally considerably greater than the width of each space 58. The plurality of gate segments 56 extend in a parallel longitudinal relationship with one another and in parallel rows which are laterally spaced from one another by the width of the spaces 58. Each gate segment 56 extends substantially completely between the source and drain diffusion areas 22 and 24, respectively. Preferably, and as is described more completely below in conjunction with the fabrication method of the FET 20, the material of the gate structure 28, including the gate segments 58 and bridge segment 60 is in situ doped polysilicon, which is deposited during a single process step. However, the gate structure 28 could be other materials, such as most metals, specifically, those used in CMOS processing including, aluminum, tungsten or titanium-nitride. More specifically, but not limited to, the refractory metals (groups 5 to 10 on the periodic table) with low oxidation affinity and their alloys are preferred, including tungsten, tantalum, titanium-nitride, tantalum-nitride, platinum, etc. All of the above metals can also be used in a composite structure such as TiN covered by aluminum.

The gate structure 28 may thereby be formed using conventional CMOS FET fabrication techniques. Specifically, the metal can be deposited by a number of techniques, including, but not limited to, metal organic chemical vapor deposition (MOCVD) or physical vapor deposition (PVD) as well as related sputter or chemical vapor deposition (CVD) techniques. If the gate segments 56 have a high aspect ratio (approximately greater than 3:1), an MOCVD technique is preferred as it yields the best trench fill characteristics for high aspect ratio trench-like structures. The gate material would be deposited in the same sequence of steps as that for in situ doped polysilicon. In addition, the metal gate material can be patterned using standard photolithography techniques and etched using either wet or dry techniques, including fluorine or chlorine-based dry etching, ammonium hydroxide/hydrogen peroxide wet chemical etching, etc. Dry etch techniques are preferred in that selectivity can be optimized relative to the gate oxide.

The gate segments 56 of the gate structure 28 are positioned in an interdigitated manner with respect to the channel segments 40 of the channel structure 26, as shown in FIGS. 1, 4 and 8. The width of the channel segments 40 and gate oxide layer 50 of the channel structure 26 fit within the spaces 58 between the gate segments 56 of the gate structure 28. Similarly, the gate segments 56 fit within the spaces 46 between the channel segments 40. Further still, the rounded upper end 48 of each channel segment 40 fits within a rounded end 62 at the upper end of each space 58 between the gate segments 56. Moreover, a generally rectangular lower end 64 of each gate segment 56 fits within the generally rectangular lower end 52 of the spaces 46 between the channel segments 40.

The gate oxide layer 50 adjoins and extends continuously between the channel and gate segments 40 and 56, respectively, including around the rounded upper ends 48 of the channel segments 40 and across the rectangular lower ends 52 of the spaces 46. The interdigitated channel and gate segments 40 and 56 adjoin and contact on opposite sides of the gate oxide layer 50 as a result of the self-aligning manner of fabricating the channel segments 40 and the gate segments 56 using conventional and reliable CMOS fabrication techniques, as is described below.

The interdigitated position of one gate segment 56 on each lateral side of each channel segment 40 forms a dual-electrode gate structure 28. Gate control voltages applied to the gate structure 28 are present in the gate segments 56, and those voltages create field effects on both sides of the channel segments 40 which influence the conductivity characteristics of the FET 20. Because the channel segments 40 are sufficiently narrow in width, commonly-used levels of gate control voltages are capable of achieving fully-depleted and fully-inverted conductivity characteristics in each channel segment 40, thereby achieving improved conductivity characteristics.

Adverse short channel effects are avoided or greatly reduced because of the dual-electrode aspects of the gate structure 28, allowing the FET 20 to be fabricated with a relatively small aspect ratio. The depth of the source and drain areas 22 and 24 can be established to enhance breakdown characteristics without being restricted by the aspect ratio of the FET. The FET 20 can be constructed using known and conventional CMOS techniques, as explained below in conjunction with FIGS. 9–21.

The process of fabricating the FET 20 (FIG. 1) begins with a conventional wafer, such as a bulk wafer, which has a P-doping concentration. Although more costly, the present invention may also be fabricated beginning with an epitaxial wafer. The doped wafer forms the substrate 30, shown in FIG. 9. A thin support oxide layer 70 is next thermally grown or deposited on the top surface 42 of the substrate 30, in a conventional manner. Thereafter, a layer 72 of silicon nitride is grown or deposited on a top surface of the support oxide layer 70. The silicon nitride layer 72 is also grown or deposited in a conventional manner. Creating the support oxide layer 70 and the silicon nitride layer 72 is a typical process sequence of almost all CMOS processes.

Next, a P-well 74 is implanted through the layers 70 and 72 into the substrate 30. The P-well 74 implant is accomplished conventionally, using a high energy beam of the substance implanted. The doping concentration of the implanted P-well 74 is selected to obtain the desired concentrations of carriers for what will become the channel segments 40 (FIG. 1). The P-well 74 is implanted at this relatively early stage of the fabrication process to take advantage of the field oxidation process to smooth out the P-well profile. In a fully depleted CMOS FET, a uniform doping concentration of the channel segments 40 (FIGS. 1–4) is desired. The N wells for the other CMOS devices of the IC (not shown) are formed in the substrate 30 at this time.

The silicon nitride layer 72 is thereafter patterned as part of a conventional local oxidation of silicon (LOCOS) isolation process. The silicon nitride layer 72 is patterned using conventional photoresist deposition, photolithographic exposure and etching techniques, as shown in FIG. 10. The silicon nitride layer 72 is etched away to the support oxide layer 70 in all locations other than at the remaining segment 76 of the silicon nitride layer 72. In general, the shape of the remaining segment 76 of silicon nitride will generally define the area in the substrate 30 where the FET 20 (FIG. 1) will be formed. The segment 76 is also used to define the boundaries of the field oxide in the LOCOS process. Thus, this boundary also delineates where the active region of the FET 20 exists. Since the wells of the other active areas on the substrate 30 are subject to the LOCOS field oxidation process, it may be necessary to perform field isolation for those active areas and wells at this stage of the fabrication process. While a LOCOS isolation process is preferred, other isolation processes, such as a shallow trench isolation process can be used with appropriate changes in the process flow.

Next, as shown in FIG. 11, the field oxidation process has grown the support oxide layer 70 into the considerably-thicker field oxide layer 78 at the outside of the silicon nitride segment 76. Growing the relatively thicker field oxide layer 78 from the support oxide layer 70 (FIG. 10) has caused the thicker field oxide layer 78 to encroach under the peripheral edges of the silicon nitride segment 76. The peripheral edges of the silicon nitride segment 76 are thereby slightly lifted, as shown in FIG. 11.

The segment 76 of silicon nitride is thereafter stripped or removed, preferably in a hot phosphoric acid bath, as shown in FIG. 12. The first support oxide layer 70 (FIG. 11) is also removed or stripped with the same process. A buried layer implant 80 may thereafter be formed, particularly if the substrate is a bulk substrate.

The buried layer implant 80 is formed in a conventional manner using P+ material by delivering a desired species into the substrate 30 with a high energy beam. The implant 80 extends below the depth of the P-well 74, and in the areas not covered by the field oxide layer 78, the depth of the buried layer implant 80 is somewhat deeper than in the areas where the field oxide layer 78 has reduced the energy of the ion implementation beam. The buried layer implant 80 becomes the boundary between the substrate 30 and the P-well 74. The buried layer implant 80 is also used to improve latch-up immunity if a bulk substrate 30 is employed. If an epitaxial substrate is used in the fabrication process, no buried layer implant is needed to achieve the same level of latch-up immunity. In general, other types of techniques may be used to create certain isolation, electrostatic discharge and latch-up specifications while still creating a relatively deep, uniformly-doped well area in which to fabricate the channel segments 40 (FIGS. 1–4).

Following the step of implanting the buried layer 80, the implant 80 is annealed. The annealing step is performed in a conventional CMOS manner in a neutral ambient gas mixture. The annealing step eliminates some of the damage caused by implanting the buried layer implant 80.

Next, after a number of conventional cleaning and sacrificial oxidation steps, a support layer 82 of oxide is formed on an upper exposed surface of the P-well 74, as shown in FIG. 13. The support oxide layer 82 extends between the segments of the field oxide layer 78 and over the upper surface of the P-well 74 where the gate and channel structures of the FET are to be formed into and on top of the P-well 74. Thereafter, a layer 84 of silicon nitride is formed on top of the support oxide layer 82 and on the upper exposed surfaces of the field oxide layer 78. The formation of the support oxide layer 82 and the silicon nitride layer 84 is accomplished by conventional techniques, such as growing or depositing the materials.

Next, as understood from FIG. 14, a relatively thick layer 86 of photoresist is applied over the entire top surface of the silicon nitride layer 84. The photoresist layer 86 is deposited by conventional CMOS fabrication techniques. Thereafter the photoresist layer 86 is photographically patterned using a mask (not shown). The photoresist layer 86 is exposed and developed to leave a sequence of relatively tall columns 88 of photoresist above the silicon nitride layer 84. The relatively tall columns 88 of developed photoresist extend the length of the area where the channel structures 26 (FIGS. 1 and 3) of the FET are to be formed. The columns 88 will be used as masks to form the channel segments 40, and thus the columns 88 are positioned to generally extend parallel to the positions where the channel segments 40 will be formed.

The lateral width of the developed photoresist columns 88 is preferably made as small as possible, using conventional photolithographic techniques. At the time of this invention, the worldwide, large-scale manufacturing of line widths of about 0.25 micrometers ($\mu$m or microns) is becoming conventional. However, as will be seen from the discussion below, the channel segments 40 must have considerably narrower widths in order to obtain fully-depleted and fully-inverted conductive characteristics. Nevertheless, the present method of fabricating the FET allows conventional photolithographic patterning techniques to be used in creating masking columns of developed photoresist which are too wide to establish channel segments of widths capable of fully-depleted and fully-inverted conduction, while nevertheless achieving channel segments capable of fully-depleted and fully-inverted performance.

A conventional reactive ion etching process is next applied while using the developed photoresist columns 88 as masks, as understood from FIG. 15. With the columns 88 of developed photoresist (FIG. 14) remaining in place, a first reactive ion etching step erodes the silicon nitride layer 84 down to the support oxide layer 82. Thereafter a second reactive ion etching step is applied to erode and break through the support oxide layer 82. A third reactive ion etching step thereafter erodes the silicon of the P-well 74 to form slots or trenches 90 in the P-well 74. The trenches 90 define and separate pillars 92 of material from the P-well 74. The three reactive ion etching steps may be performed using three separate etch tools, or the reactive ion etching steps may be performed in a single multi-chamber etch tool such as the Applied Materials 5000 series, where each reactive ion etch step is performed in a separate chamber which is seasoned for that particular step. Other combinations of tools and methods are also capable of performing multiple etching steps illustrated by FIG. 15.

The columns 88 of developed photoresist may be left in place while the three reactive ion etching steps described in conjunction with FIG. 15 are accomplished. However in some circumstances, the photoresist columns 88 and the remaining layer 86 of photoresist (FIG. 14) may be removed before the support oxide layer 82 and the material of the P-well 74 is etched. In any event, the photoresist layer 86 and columns 88 are ultimately removed either during or after the conclusion of the three etching sequences represented by FIG. 15. Cap segments 94 and 96 of support oxide 82 and silicon nitride 84, respectively, remain on top of the pillars 92 after the three-step sequence of reactive ion etching is completed.

Further details of the three-step sequence of reactive ion etching are illustrated in FIGS. 16A, 16B, 16C, 16D, 16E, 16F and 16G in conjunction with forming a single pillar 92. In addition, these Figures illustrate a technique of creating slightly rounded upper ends 98 (FIG. 16G) on the pillars 92.

A fully developed column 88 (shown broken in length) formed from the photoresist layer 86 (FIG. 14) is shown in FIG. 16A. The dashed reference lines 100 illustrate the width of the developed photoresist column 88, established as a result of the conventional photolithographic patterning techniques. The first reactive ion etching step is shown accomplished in FIG. 16B, with the silicon nitride layer 84 having been eroded through to the support oxide layer 82. The silicon nitride layer 84 has also been formed into the silicon nitride cap 96 (FIG. 15). The second reactive ion etching step is shown accomplished in FIG. 16C, where the support oxide layer 82 has been eroded to form the support oxide cap 94 (FIG. 15). As shown in FIGS. 16B and 16C, the width of the developed photoresist column 88 and the widths of the silicon nitride cap 96 and the support oxide cap 94 are approximately the same and about equal to the distance between the reference lines 100 which define the original width of the developed photoresist column 88.

As shown in FIG. 16D, the width of the developed photoresist column 88 has been eroded, so that the width of the column 88 at this stage of the fabrication process is somewhat less than the original width of the developed photoresist column shown by the reference lines 100. The erosion of the photoresist column 88 occurs as a result of a change in the etch chemistry. As a result, the width of the column 88 is somewhat set inwardly from the outer horizontal edges of the silicon nitride cap 96.

Thereafter, as shown in FIG. 16E, a further change in the etch chemistry results in a laterally inward erosion of the outside edges of the silicon nitride cap 96 and the support oxide cap 94. The laterally inward erosion of the caps 94 and 96 is apparent by comparison to the reference lines 100. The caps 94 and 96 are laterally inwardly eroded to a greater degree than the pillar 92. As illustrated in FIG. 16E, the change in etch chemistry does not affect the upper lateral outside corners of the pillar 92, because those corners remain substantially square and to about the same width as the reference lines 100. A further adjustment in the etch chemistry and a continuation of the reactive ion etching process rounds the upper outside corners of the pillars 92 while simultaneously completing the formation of the pillars 92 by eroding the trenches 90 (FIG. 15) to their desired depth, as shown in FIG. 16F.

The sequence of erosion chemistry steps illustrated in FIGS. 16D, 16E and 16F may be accomplished using ashing-type chemistries at appropriate steps in the etch fabrication process shown by these Figures. Similar techniques are used in forming shallow trench isolation structures, where similar corner effects cause leakage. Such process steps may be readily implemented using multi-chamber etch systems, such as the AME 5000 discussed above.

The developed photoresist columns 88 are next removed from on top of the silicon nitride cap 96, using conventional CMOS fabrication techniques. The silicon nitride cap 96 and the support oxide cap 94 are left in place, as shown in FIG. 16G.

As is apparent, the width of the pillars 92 is dictated by the width of the developed columns 88 of photoresist, which are created by using conventional photolithographic patterning techniques. The width of the pillars 92, however, is too wide to support fully-depleted and fully-inverted conductivity in the channel segments 40. An important aspect of the fabrication method of the present invention is to reduce the width of the pillars 92 to the narrower width of the channel segments 40 to support fully-depleted and fully-inverted conductivity. Even if the narrowing or thinning does not result in a sufficiently narrow channel to achieve fully-depleted or fully-inverted channel behavior, the process results in greater control over channel behavior and therefore allows a smaller sized FET to be fabricated before encountering the adverse short channel effects.

A subtractive oxidation process, shown in FIG. 17, is used to narrow the width of the pillars 92 into the channel segments 40 (FIGS. 1–3). The subtractive oxidation process preferably involves thermally oxidizing the P-well material 74 defining the pillars 92, while the caps 94 and 96 of the support oxide layer 82 and silicon nitride layer 84 (FIG. 16G) remain in place. The oxidation process consumes the material of the pillars 92 laterally inward from their vertical outside surfaces and creates an oxide layer 102 on the exterior of the pillars 92, as shown in FIG. 17. The subtractive oxidation also consumes the P-well material 74 at the bottom rectangular ends 104 of the trenches 90, and the rounded corners 98 (FIG. 16G) at the top ends of the pillars 92. The oxidation of the outer layer 102 of the pillar 92 into the oxide layer 102 is preferably accomplished thermally, either wet or dry, or a combination of wet and dry oxidation steps, for example dry-wet-dry procedures.

After the oxidation step illustrated in FIG. 17, the oxide layer 102 is removed isotropically, by a wet or vapor etch technique, and preferably in a wet bath of hydrofluoric acid, resulting in the channel segments 40 shown in FIG. 18. Removing the oxide layer 102 results in narrowing the width of the pillars 92 into the desired width of the channel segments 40. The final width of the pillars 92 is equal to the initial width of the pillars 92 (represented by the reference lines 100 (FIGS. 16A–16G) less twice the thickness of the oxide layer 102, with the thickness of the oxide layer 102 represented by a reference dimension 106 shown in FIG. 17. Parametric control over the final width of the channel segments 40 is performed indirectly by measuring the width of the pillars 92 following their initial etching using a scanning electron microscope. The thickness 106 of the consumptive oxide layer 102 is thereafter controlled using conventional CMOS manufacturing techniques, such as elipsometry. The thickness 106 of the consumptive oxide layer 102 can be measured and controlled within several angstroms in a conventional fabrication environment.

The removal of the oxide layer 102 from the bottom ends 104 of the trenches 90 has the effect of further deepening the trenches by the thickness 106 of the oxide layer 102 along the bottom ends 104. However, the top ends of the pillars 92 are not diminished in length because the support oxide and silicon nitride caps 94 and 96, respectively, prevent the growth of the consumptive oxide layer 102 at the top ends of the pillars 92. The growth of the oxide layer 102 at the top outside rounded ends 98 (FIG. 16G) of the pillars 92 beneath the support oxide caps 94 tends to push the lateral outside edges of the caps 94 and 96 upward, because of the greater growth of the oxide layer 102 at these locations 108.

The relatively greater growth of the oxide layer 102 at the location 108 of the pillars 92 promotes the creation of upper generally rounded ends 48 on the resulting channel segments 40. Ideally, the upper rounded ends 48 would be made fully rounded as shown in FIGS. 3 and 19, but realistically, the upper rounded ends 48 will have a more flat top with rounded corners as shown in FIG. 17. The greater consumption of the pillars 92 at the locations 108 by the oxide layer 102 results in a greater radius of curvature of the rounded ends 48 (FIGS. 3 and 19) at the inner interface surface of the oxidation layer 102 with the pillar 92. Once the oxide layer 102 is removed, the upper rounded ends 48 have been formed. The enhanced oxidation at the locations 108 tends to lift the support oxide and silicon nitride caps 94 and 96, respectively. The enhanced oxidation at the locations 108 will not create a well-known "bird's beak" sharpened edge configuration at the upper corners of each pillar 92. The previously rounded corners 98 (FIG. 16G) are further rounded by the growth of the oxidation layer 102, as shown in FIG. 17, preventing such sharpened edges. By preventing sharpened edges, Fowler-Nordheim tunneling from the gate to the channel segments 40, oxide breakdown and diminished gate oxide integrity are avoided.

Thereafter, the silicon nitride cap 96 and the support oxide layer 94 are removed, preferably also in a wet bath of hot phosphoric acid followed by hydrofluoric acid. The resulting configuration is the channel segment 40 (FIGS. 1 and 3). The pillars 92 have been narrowed and formed into the channel segments 40 (FIGS. 1 and 3), while the trenches 90 (FIG. 15) have been widened and formed into the spaces 46 (FIGS. 2 and 3) between the channel segments 40. Following the removal of the caps 94 and 96, various conventional cleaning steps and annealing steps are performed in order to treat the channel segments 40.

The fabrication of the channel segments could result in the creation of parasitic surface FETs, or single-gated FETs, at the top rounded ends 48 of the channel segments 40 and in the P-well 74 along the bottom ends 104 of the spaces 46 between the channel segments 40. Such parasitic surface FETs contribute additional capacitance, and may potentially degrade the short-channel characteristics of the FET. Since these parasitic surface FETs effectively have only a single gate, their threshold voltage is significantly less than that of the dual-gate FET 20 at shorter channel lengths, permitting a possible short between the source and drain due to short channel effects at a voltage level below the desired threshold voltage of the FET 20.

Parasitic surface FETs of this nature may be eliminated by an implant layer 110 of material on the top ends of the channel segments 40 and in the bottom ends 104 of the spaces 46 (FIG. 18). The implant layers 110 increase the threshold voltage for these parasitic surface FETs above the threshold voltage for the dual-gated FET 20, effectively shutting off the parasitic surface FETs, leaving only the channel segments 40 which are capable of conduction in a fully-depleted or fully-inverted manner. The species implanted in the layer 110 may be boron with the P-well 74. If a P-channel FET structure according to the present invention is constructed, the species implanted in the layer 110 may be arsenic or phosphorus.

Next as shown in FIG. 19, the gate oxide layer 50 is formed on the exterior surfaces of the channel segments 40 and on the rectangular lower end 52 of the spaces 46 between the channel segments 40. The gate oxide layer 50 may be formed to the depth required to achieve a desired pillar thickness and length. The desired performance specifications of the FET structure described herein follow a more relaxed scaling law compared to a conventional planar FET structure. The more relaxed scaling law results in less necessity to reduce the drain voltage potential (Vdd).

FIG. 20 illustrates the stage of fabrication of the entire FET structure after the completion of the processing step described in FIG. 19. The stage of fabrication illustrated in FIG. 20 exists prior to the formation of the gate structure 28.

To fabricate the gate structure 28, as shown in FIG. 21, gate material 112, such as polysilicon, is deposited over the entire wafer such that gate material fills in the spaces 46 between the channel segments 40. The gate material 112 formed within the spaces 46 becomes the gate segments 56, which adjoin the gate oxide 50 (FIGS. 2, 3 and 19). The gate material 112 is deposited in a self aligning manner with the channel segments 40, so the gate segments 56 conform to the gate oxide layer 50 (FIG. 19) and the shape of the channel segments 40, including the upper rounded ends 48 and the lower ends 52 of the spaces 46 (FIG. 19).

The deposition of the gate material 112 continues until the bridge segment 60 is also formed and the gate material 112 extends in a layer on top of the field oxide layer 78. The gate segments 56 are integrally connected with the bridge segment 60 as a result of this single-step formation, and the bridge segment 60 is integrally connected to the layer which includes the gate contact 36. The material 112 from which the gate structure 28 is formed is preferably in situ doped polysilicon. Thereafter, the gate structure may be photolithographically patterned and etched to create the desired shape of the bridge segment 60 and the gate contact 36 (FIGS. 1, 3 and 21).

Upon completion of the structure illustrated in FIG. 21, including post-gate processing such as spacer formation, the source and drain diffusion areas 22 and 24 (FIGS. 1 and 4) are formed using conventional planar CMOS processing techniques. Thereafter, the source and drain contacts 32 and 34 are formed on the source and drain diffusion areas 22 and 24, respectively. Thus, the basic structure of the FET 20 is completed. Any further processing associated with the IC of which the FET 20 is a part, may thereafter be completed in the conventional manner.

The FET 20 described above is generally symmetrical, so it is essentially bidirectional. Thus, unlike the prior art surrounding-gate devices described above, the FET 20 has the advantage of being able to create a CMOS switch, or pass gate.

Each individual channel segment 40, surrounded by gate material 56, of the FET 20 of the present invention bears some superficial resemblance to a prior art delta configuration FET 200 shown in FIG. 22, but with significant differences. The FET 200 has a channel region 202 surrounded by a gate 204. An oxide layer 206 separates the channel region 202 and the gate 204. A field oxide procedure adds oxide to an oxide area 208 below the channel region 202. The field oxide is added around the bottom of the gate 204, causing the bottom of the gate 204 to bow outward slightly, the natural consequence being that the channel region 202 is effectively "pinched off" from the underlying silicon 210.

The significant differences of the FET 20 of the present invention compared to the prior art delta configuration FET 200 are noted. The FET 20 has an array of channel segments 40, instead of a single channel region 202, so the FET 20 may be scaled for greater or lesser current capacities by extending or shortening the array without significantly altering the operational characteristics of the FET 20. Each of the channel segments 40 can be made considerably thinner than the channel region 202 for greater control by the gate electric field of the conductivity through the channel segments 40 over shorter channel lengths. The resulting shorter channel lengths permit a smaller longitudinal dimension of the FET 20 than for the FET 200. The channel segments 40 may be considerably shorter in height than the channel region 202, so the processes that construct the channel segments 40 may be less time consuming and less complicated than the processes that form the channel region 202. Additionally, since the channel segments 40 are considerably shorter in height than the channel region 202, the FET 20 actually has an overall planar configuration, which requires overall fabrication processes than does the tall vertical wall configuration of the FET 200. The channel segments 40 of the FET 20 intentionally are not pinched off from the underlying silicon, so snapback or parasitic transistors that may pose problems for the FET 200 do not occur in the FET 20.

An alternative FET structure 214 for preventing perimeter leakage, is shown in FIG. 23. Perimeter leakage is an undesirable parasitic FET condition that can permit conductance between the source and drain around the outside of the channel structure. Pockets 212 of dopant are placed adjacent to the outermost gate segments 99 along the entire length of the FET structure 214 from the source to the drain. The dopant pockets 212 may cover only the two sides of the FET structure 214 adjacent the outermost gate segments 99 or may completely circumscribe the FET structure 214, including the source, the drain and the gate and channel. To provide a current barrier for an N-channel FET, the dopant of the pockets 214 should be a p-type, such as boron; and for a P-channel FET, the dopant should be an n-type, such as arsenic or phosphorus. The dopant pockets 212 could be formed in an intermediate ion implantation process step in which the regions to be left undoped are covered by a photoresist mask material. The dopant pockets 212 may alternatively be formed in a process step when the silicon nitride ($SiN_4$) layer 84 (FIG. 13) still overlays the channel region to effectively mask this region, while a photoresist mask material covers other regions to be left undoped. Alternatively, perimeter leakage could be reduced or eliminated by providing the outermost gate segments 99 as "dummy gates" that do not serve as actual gates, but rather are held to a constant low potential, preferably the lowest potential used in the IC, that is sufficiently below the threshold voltage to prevent current in that region. The dummy gate could also be used in conjunction with the dopant pockets to optimize the prevention of perimeter leakage.

As is apparent from detailed description above, the reduced aspect ratio of the FET is achieved by use of conventional CMOS fabrication processes. The vertically-oriented channel segments are created using conventional CMOS steps, and the resulting width of the channel segments is reduced to a sufficiently narrow width to achieve fully-depleted and fully-inverted performance while using contemporary conventional photolithographic patterning techniques. Only the single additional step of subtractive oxidation is required to create the vertically-oriented channel structure, beyond the steps normally employed in conventional CMOS FET fabrication. The thickness of the gate oxide, and the resulting reliability of performance and useful lifetime, is less sensitive to the reduction in the FET power supply voltage levels.

The dual-gate structure is formed using conventional self-aligning CMOS material deposition techniques. The FET structure may be fabricated on bulk substrate, avoiding the added costs associated with epitaxial or SOI substrate processing. The overall processing steps required do not involve the added additional complexity associated with forming dual-gate FETs by SOI techniques. The configuration of the dual-gate and channel structures avoids parasitic and snapback problems common to SOI structures.

Fully-depleted and fully-inverted conductivity characteristics are achieved, without significant influence from adverse short channel effects, at a higher Vdd, despite the reduced size of the FET. The fully-depleted and fully-inverted conductivity characteristics are obtained from a bulk substrate without the need for special SOI fabrication, an epitaxial substrate or the epitaxial growth of structures within the FET structure. Despite the shorter channel length, an enhanced source-drain breakdown voltage characteristic is obtained because the source and drain regions may be implanted to greater depths than would be required from normal CMOS scaling theory.

An enhanced tolerance for, or an increased capability to withstand, higher supply voltages is obtained because of the ability to increase the thickness of the gate oxide while still achieving a reduced aspect ratio FET. The dual-gate structure, with respect to current flow and the source-drain junctions, results in greater immunity to hot electron impact, which prolongs the useful longevity of the FET.

In general, the FET structure of the present invention may be fabricated on a reliable, economic, large-scale commercial basis, despite the size reduction, using reliable contemporaneous CMOS manufacturing technology rather than complex special manufacturing techniques necessary to form dual-gate SOI FET structures. Many better improvements and advantages will be apparent after the present invention is completely understood.

Presently preferred embodiments of the invention and its improvements have been described with a degree of particularity. This description has been made by way of preferred example. It should be understood that the scope of the present invention is defined by the following claims, and should not be unnecessarily limited by the detailed description of the preferred embodiment set forth above.

The invention claimed:

1. A method of fabricating a field effect transistor (FET) in a starting material, comprising the steps of:
    forming a source area in the starting material;
    forming a drain area in the starting material;
    forming a plurality of channel segments in the starting material which extend longitudinally between the source and drain areas and which are laterally separated from one another by spaces;
    forming a gate structure in the spaces between the channel segments;
    laterally oxidizing the starting material within the spaces; and
    removing the lateral oxidation from the starting material to form the channel segments.

2. A method of fabricating a field effect transistor (FET) in a starting material, comprising the steps of:
    forming a source area in the starting material;
    forming a drain area in the starting material;
    forming a plurality of channel segments in the starting material which extend longitudinally between the source and drain areas and which are laterally separated from one another by spaces;
    forming a gate structure in the spaces between the channel segments;
    forming the spaces longitudinally in the starting material between the source and drain areas to define longitudinal pillars of the starting material;
    oxidizing the pillars laterally within the spaces; and
    removing the lateral oxidation from the pillars to form the channel segments of a width less than a width of the pillars by the amount of the lateral oxidation of each pillar.

3. A method as defined in claim 2, further comprising the steps of:
    forming an etch-resistant barrier on top of the starting material at the location of each pillar; and
    etching the spaces into the starting material between each of the etch-resistant barriers on top of each pillar.

4. A method as defined in claim 3 further comprising the steps of:
    placing a layer of photoresist material on the starting material: and
    forming the etch resistant-barriers by photolithographically exposing and developing the layer of photoresist material.

5. A method as defined in claim 4 further comprising the step of:
    making the width of the etch-resistant barrier as narrow as possible by photolithographic exposure.

6. A method as defined in claim 5 further comprising the step of:
    oxidizing the pillars laterally to reduce the width of the pillars into channel segments having a width substantially less than the width of the etch resistant barrier.

7. A method as defined in claim 3 further comprising the step of:
    oxidizing the pillars laterally with the etch-resistant barrier remaining on top of the pillars.

8. A method as defined in claim 3 further comprising the step of:
    laterally etching the etch-resistant barrier to reduce the width of the barrier and to expose upper corners of each pillar to erosion when etching the spaces.

9. A method as defined in claim 8 wherein the etch resistant barrier comprises cured photoresist, material.

10. A method as defined in claim 3 further comprising the step of:
    forming an oxidation-resistant cap on top of each pillar prior to etching the spaces.

11. A method as defined in claim 10 further comprising the step of:
    laterally etching each oxidation-resistant cap to reduce the width of each cap and expose upper corners of each pillar to erosion when etching the spaces.

12. A method as defined in claim 11 wherein the oxidation-resistant barrier comprises silicon nitride.

13. A method as defined in claim 10 further comprising the step of:
    forming an oxide cap layer between the oxidation-resistant cap and an upper end of each pillar.

14. A method as defined in claim 13 further comprising the step of:
    laterally etching each of the oxidation-resistant caps and the oxide cap layers to reduce the width of each oxidation-resistant cap and of each oxide cap to expose upper corners of each pillar to erosion when etching the spaces.

15. A method as defined in claim 13 further comprising the step of:
    growing the oxidation of the pillars beneath each oxide cap at laterally outer locations adjacent to side walls of the pillars and beneath the oxide cap to a greater thickness than the thickness to which the side walls of the pillars are laterally oxidized.

16. A method as defined in claim 13 further comprising the step of:
    oxidizing the upper lateral outside edges of each pillar to create a rounded corner configuration beneath each oxide cap.

17. A method as defined in claim 13 further comprising the step of:
    forming rounded upper edges of the channel segments by oxidizing the upper lateral outside edges of each pillar beneath each oxide cap.

18. A method as defined in claim 17 further comprising the step of:
    removing the oxidation-resistant and oxide caps after laterally oxidizing the pillars.

19. A method as defined in claim 2 further comprising the step of:

forming upper rounded longitudinally-extending edges on the channel segments.

20. A method as defined in claim 19 further comprising the step of:

implanting a layer of material into the upper end of each channel segment.

21. A method as defined in claim 20 further comprising the step of:

implanting a layer of material into the material beneath each space.

22. A method as defined in claim 21 wherein the material of the implanted layers at the upper ends of the channel segments and at the lower end of the spaces is the same material.

23. A method as defined in claim 22 wherein the material of the implanted layers at the upper ends of each channel segment and the lower end of each space between the channel segments turns off any parasitic surface transistor at those locations.

24. A method as defined in claim 2 further comprising the step of:

protecting an upper end of the pillars against oxidation during lateral oxidation of the pillars.

25. A method as defined in claim 2 further comprising the step of:

oxidizing each pillar sufficiently to establish each channel segment with a lateral width which is sufficiently narrow to obtain fully-depleted conductivity characteristics.

26. A method as defined in claim 2 further comprising the step of:

oxidizing each pillar sufficiently to establish each channel segment with a lateral width which is sufficiently narrow to obtain fully-inverted conductivity characteristics.

27. A method as defined in claim 1 further comprising the step of:

forming the starting material by forming a well in a substrate material.

28. A method as defined in claim 1 further comprising the step of:

forming the channel segments in a generally rectangularly shaped configuration.

29. A method as defined in claim 1 further comprising the step of:

forming the channel segments in a generally parallel aligned relationship with one another.

30. A method as defined in claim 1 further comprising the step of:

forming the channel segments with a generally vertical orientation in a height dimension.

31. A method as defined in claim 30 further comprising the step of:

forming the gate structure with a plurality of generally vertically oriented gate segments positioned between the vertically oriented channel segments.

32. A method as defined in claim 1 further comprising the step of:

forming the source and drain areas generally in a planar configuration.

33. A method as defined in claim 1 further comprising the step of:

implanting the source and drain areas into the starting material.

34. A method as defined in claim 1 further comprising the step of:

forming the gate structure as a plurality of gate segments extending in the spaces between the channel segments and a bridge structure extending generally in a lateral direction over the channel segments and connected to upper ends of the gate segments.

35. A method as defined in claim 34 further comprising the step of:

the gate structure is formed from deposited material.

36. A method as defined in claim 35 further comprising the step of:

the gate structure is formed from in situ doped polysilicon.

37. A method as defined in claim 34 further comprising the step of:

each channel segment has a lateral width which is substantially less than a lateral width of each gate segment.

* * * * *